(12) United States Patent
Hara et al.

(10) Patent No.: US 6,983,011 B1
(45) Date of Patent: Jan. 3, 2006

(54) FILTER CIRCUIT

(75) Inventors: Keita Hara, Kashihara (JP); Kunihiko Iizuka, Sakurai (JP)

(73) Assignee: Sharp Kabushiki Kaisha, Osaka (JP)

( * ) Notice: Subject to any disclaimer, the term of this patent is extended or adjusted under 35 U.S.C. 154(b) by 799 days.

(21) Appl. No.: 09/598,954

(22) Filed: Jun. 22, 2000

(30) Foreign Application Priority Data

Jun. 22, 1999 (JP) ............................... 11-175178
Mar. 7, 2000 (JP) ............................. 2000-062566

(51) Int. Cl.
H03H 7/30 (2006.01)

(52) U.S. Cl. ............... 375/229; 375/153; 375/343; 341/143; 341/77; 327/551; 327/554

(58) Field of Classification Search ............... 375/229, 375/153, 343; 327/551, 554; 341/143, 77; 702/190
See application file for complete search history.

(56) References Cited

U.S. PATENT DOCUMENTS

| | | | | |
|---|---|---|---|---|
| 4,156,919 A | * | 5/1979 | Constant | 708/306 |
| 5,124,703 A | * | 6/1992 | Kaneaki et al. | 341/77 |
| 5,255,202 A | * | 10/1993 | Kido et al. | 702/190 |
| 5,392,040 A | * | 2/1995 | Hayashi | 341/143 |
| 5,960,033 A | | 9/1999 | Shibano et al. | 375/152 |
| 6,300,823 B1 | * | 10/2001 | Zhou et al. | 327/551 |
| 6,563,373 B1 | * | 5/2003 | Shou et al. | 327/554 |
| 6,625,205 B1 | * | 9/2003 | Zhou et al. | 375/153 |
| 6,665,358 B1 | * | 12/2003 | Odagiri | 375/343 |

FOREIGN PATENT DOCUMENTS

| | | |
|---|---|---|
| JP | 03-087986 A | 4/1991 |
| JP | A983486 | 3/1997 |
| JP | B2-2773075 | 4/1998 |

OTHER PUBLICATIONS

Vikram, Transposed Form FIR Filters, Oct. 25, 2001, Xilinx, Inc. P1-13.*
Toker,Performance Analysis of a Joint Matched Filter Based Synchronization Method for Direct Sequence Spread Spectrum Radio,2001, IEEE, P2424-2428.*
Rothenberg et al., IEEE, vol. 30, No. 12, pp. 1350-1356 (1995).

* cited by examiner

Primary Examiner—Shuwang Liu
Assistant Examiner—Eva Zheng
(74) Attorney, Agent, or Firm—Birch, Stewart, Kolasch & Birch, LLP

(57) ABSTRACT

In a filter circuit of the present invention, a partial quantization value is computed by a quantization circuit according to a spread code and others in a unit at an arbitrary stage, where an integrating value is increased. The partial quantization value is successively added by an adder formed by a counter and is transmitted to a unit of the following stage. In an adder of the following stage, an analog residual is computed by subtracting an analog converted value of the partial quantization value, that is obtained by a D/A converter, from the integrating value so as to suppress an increase in the analog cumulative value. With this arrangement, the cumulative value is increased according to an increase in the number of taps, so that an analog adder can reduce power consumption, which is caused by expansion of a dynamic range at the following stage.

23 Claims, 19 Drawing Sheets

FILTER CIRCUIT

FIELD OF THE INVENTION

The present invention relates to a filter circuit which performs a sampling on a series of analog input signals, inputs them on a time series, and simultaneously multiplies a time-series analog sampling signal by a coefficient before computing, and particularly concerns a filter circuit which is suitably adopted as a matched filter and a band limitation filter of a receiver disposed in a radio using a spread spectrum method.

BACKGROUND OF THE INVENTION

Conventionally, a matched filter has been used as a reverse spread means of the spread spectrum receiver. FIG. 18 shows a construction example of a conventional N-type matched filter. In FIG. 18, dm and rm respectively represent a spread spectrum receive signal and a correlation signal, and pn represents a spread code of period N (n=0, 1, 2, ..., N−1). Assuming that an interval length (chip interval length) of the spread code pn is Tc, the receive signal dm is subjected to a sampling with the same period as the chip interval length Tc on a time series. Here, regarding the spread codes pn and pn+1, pn+1 precedes pn. In the case of other signals, for example, the receive signal dm precedes dm+1.

Assuming that an interval length (symbol interval length) is Ts regarding data subjected to spreading on a transmitting side, the relation of N=Ts/Tc is satisfied among a spread ratio N, the chip interval length Tc, and the symbol interval length Ts. As shown in FIG. 18, in the conventional matched filter, a tap number M equals to the spread ratio N. Hereinafter, for simple explanation on the operation, the receive signal dm is regarded as a baseband signal.

The delay circuit d is constituted by N−1 delay elements di (i=1, 2, ..., N−1) connected in series. The receive signal dm is inputted to a delay element di. Each delay element di has a delay time equivalent to the chip interval length Tc. And then, outputs dm-i of the delay element di and the input signal dm are respectively multiplied by the spread code pn in multiplying circuits mn, all the outputs from the multiplying circuits are added to one another in an adding circuit k. Thus, the correlation signal rm is obtained relative to the section Ts corresponding to one period of the spread signal pn.

Conventionally, the spread signal pn is constituted only by two values of "+1" and "−1", so that the conventional multiplying circuits mn reverse positive inputs and negative inputs transmitted to the adding circuit k in accordance with the spread code pn, and outputs the input signal dm and the outputs dm-i of the delay elements di. As illustrated in FIG. 18, in the matched filter, the spread code pn is fixed, and a cross-correlation function is computed relative to the receive signal dm shifted for every chip interval length Tc. When the phases of the receive signal dm and the spread code pn coincide with each other, an absolute value of the correlation signal rm rises to a maximum value. Due to periodicity of the receive signal dm and the spread code pn, the phases coincide with each other for every Ts of the symbol interval length. The point of coincidence serves as a synchronous phase and is used for synchronous capture and synchronous trace. Hence, reverse spread in the matched filter is always carried out with the interval Ts period corresponding to one period of the spread code pn, so that the stage for adjusting the phases of the receive signal dm and the spread code pn is not necessary.

Moreover, as another example of a matched filter used for a spread spectrum receiver, Japanese Published Unexamined Patent Publication No. 83486/1997 (Tokukaihei 9-83486, published on Mar. 28, 1997) discloses that a product-sum computing section is provided for performing weighted adding on a PN code to an analog input signal and for outputting the adding result as an analog output signal, the analog output of the product-sum computing section is held in an intermittent manner, a peak of the held analog signal is detected, a timing of the detected peak value is determined, the peak value of the analog signal is digitalized by an A/D converter only at a timing of the peak value.

This arrangement makes it possible to minimize the operating speed of the D/A convertor, thereby reducing power consumption.

Furthermore, as another example of the filter circuit, for example, "A 20-Msample/s Switched-Capacitor Finite-Impulse-Response Filter Using a Transposed Structure." of IEEE JOURNAL OF SOLID-STATE CIRCUITS, Vol. 30, No. 12, DECEMBER 1995, P1350–1356 discloses that a switched capacitor circuit is used to form an FIR filter as shown in FIG. 19, an input signal vi is multiplied by coefficients a1 to a4, a partial correlation value is subjected to a four-stage analog adding by pipeline method, and a correlation value vo is outputted.

According to the technique disclosed in the above document, analog computing can be performed on a correlation value having a small number of taps, with small power consumption.

Additionally, as another example of the filter circuit, Japanese Published Examined Patent No. 2773075 discloses that a matched filter technique, in which a CCD serving as a charge transmitting element is used as an analog shift register to output a correlation value. This arrangement makes it possible to perform analog computing on a correlation value having a small number of taps, with small power consumption.

The matched filter is characterized by a short synchronous capture time. However, in this case, the circuit becomes larger. Namely, when the construction of FIG. 18 is realized in a digital circuit, the adding circuit k becomes larger. This is because a digital multiple-input adding circuit can be realized only by combination of two-input adding circuits. When the number of taps is N, at least N−1 two-input adding circuits are necessary. Further, the shorter the chip interval length Tc, the higher operating speed is required, resulting in larger power consumption.

Therefore, in order to solve the above problem, as disclosed in Japanese Published Unexamined Patent Publication No. 83486/1997 (Tokukaihei 9-83486, published on Mar. 28, 1997), attention has been directed toward an analog matched filter using a reverse amplifier circuit.

Although the construction disclosed in the above publication reduces power consumption of a baseband processing section by suppressing an operating speed of the A/D convertor, a circuit for inspecting a peak of an analog signal becomes complicated. Since a peak value of an analog output signal is detected and is subjected to A/D conversion, accuracy for detecting a peak value is low in spite of the complicated circuit. Consequently, an analog spread spectrum receive signal cannot be accurately modulated.

The construction of FIG. 19 has a small number of taps with four stages. Hence, a large dynamic range is not necessary for analog adders k1 to k4. However, for a matched filter, it is necessary to add a partial correlation value for 256 to 512 times. In such a construction with multiple stages, the analog adder requires a larger dynamic range at the later stages where a large number of the partial correlation values are cumulated, to prevent saturation of the cumulated partial correlation values. Therefore, the power consumption of the adder becomes larger. Meanwhile, when the level of the partial correlation value is set lower, it is possible to reduce the dynamic range of the adder; however, the A/D converter requires high resolution to convert a correlation output vo to a digital output so as to simplify the processing of the correlation output vo in the following circuits. Consequently, the construction becomes complicated and the power consumption is increased.

Moreover, regarding the construction disclosed in Japanese Published Examined Patent No. 2773075, any problem occurs in the case of the PN code having a small number of taps. However, for practical use as a matched filter, it is necessary to add a partial correlation value for 256 to 512 times and to cumulate a larger amount of charge, resulting in degradation in S/N.

The present invention is devised to solve the above problem. The objective is to provide a filter circuit which can reduce the size and power consumption of the circuit, improve accuracy of receiving a signal even when the circuit size and power consumption is small, and realize a simple signal processing in the following circuit.

SUMMARY OF THE INVENTION

The present invention is devised to solve the above problem. The objective is to provide a filter circuit which is capable of reducing circuit size and power consumption, improving the accuracy of receiving a receive signal even in the case of small circuit size and power consumption, and processing a signal with ease in the following circuit.

In order to attain the aforementioned objective, the filter circuit of the present invention, in which a plurality of unit circuits are mutually connected in series, a computing means in each of the unit circuits successively transmits to a unit circuit of the following stage a computing result of a) an analog input signal sampled at the same sampling timing and b) a coefficient predetermined for each of the computing means, the computing means mutually adds the computing results of the present stage and its previous stage so as to compute in a unit circuit of the final stage a cumulative value of computing results of all the coefficients and time-series analog sampling signals whose number corresponds to that of the coefficients, and the cumulative value is outputted as digital data, is characterized in that low-bit quantization is subjected to an added value of an output from a unit circuit of the previous stage and the computing result of the present stage, in an arbitrary unit circuit other than the final stage, and the quantization result and a residual, the residual being obtained by subtracting a D/A converted value of the quantization result from the added value, are successively transmitted to the following unit circuit.

According to this arrangement, each of the unit circuits computes a partial correlation value, a computing result is subjected to low-bit quantization in a unit circuit at an arbitrary stage in which the cumulative value of the partial correlation values exceeds a predetermined value, and a quantization result and an analog signal of a residual are successively outputted to the following stage, the residual being obtained by subtracting an analog converted value of the quantization result from the cumulative value.

Therefore, a dynamic range of the adding means for computing the cumulative value only needs to be set such that no saturation occurs on the added value of a) a partial correlation value obtained in each of the unit circuits and b) an analog signal of the residual from the unit circuit of the previous stage. Even in the case of a multi-stage construction with 256 or 512 stages for a matched filter, it is possible to reduce the circuit size and power consumption of the adding means. Without the necessity for a high-speed A/D digital converter with high resolution, it is possible to accurately obtain a cumulative value of partial correlation values as a digital output, which is readily processed in the following circuit.

Further, the construction for low-bit quantization and for computing an analog residual is provided in a unit circuit at an arbitrary stage other than the final stage. Hence, for example, it is also possible to dispose the construction for every other stage or every two stages with even intervals in accordance with resolution of required output. This arrangement makes it possible to satisfy the required function (resolution) with a minimum circuit construction.

For a fuller understanding of the nature and advantages of the invention, reference should be made to the ensuing detailed description taken in conjunction with the accompanying drawings.

DESCRIPTION OF THE EMBODIMENTS

Figure 1:
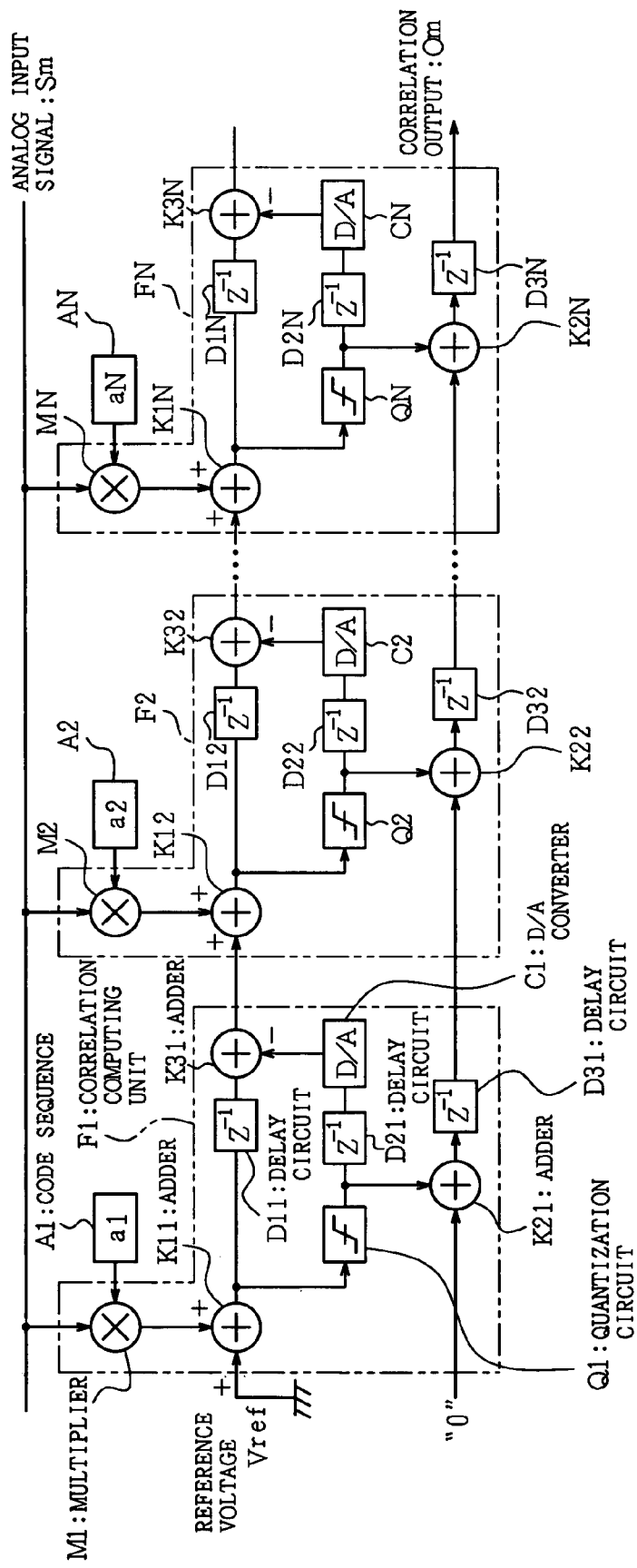
FIG. 1 is a block diagram showing an electric construction of an FIR filter according to Embodiment 1 of the present invention.

Referring to FIG. 1, the following explanation describes Embodiment 1 of the present invention.

Figure 18:
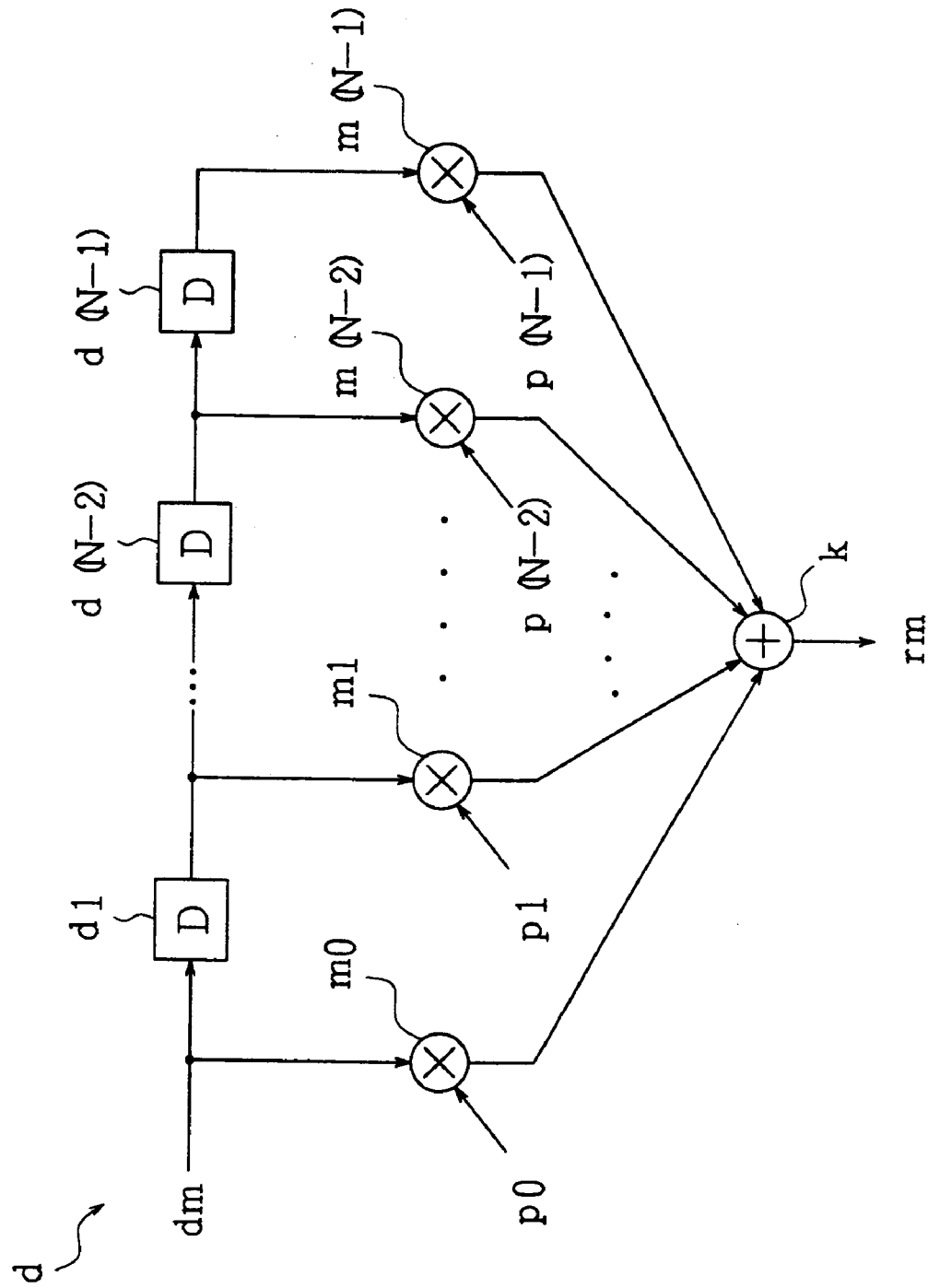
FIG. 18 is a block diagram showing an electric construction of a matched filter according to a typical conventional art.
Figure 19:
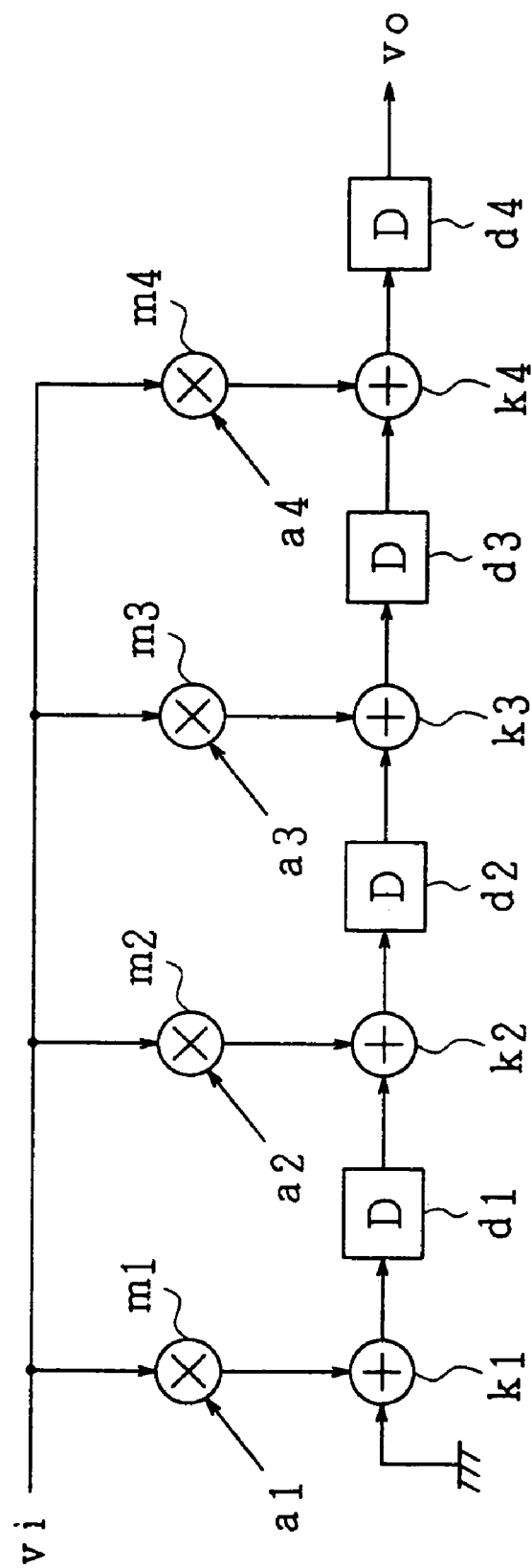
FIG. 19 is a block diagram showing an electric construction of a matched filter according to another conventional art.

FIG. 1 is a block diagram showing an electric construction of an FIR filter in accordance with Embodiment 1 of the present invention. Unlike a filter shown in FIG. 18, the FIR filter has a filter shown in FIG. 19 serving as a fundamental construction, and is constituted by N-stage correlation computing unit Fj (j=1, 2, . . . , N, and hereinafter, subscript j is omitted when collectively called) connected in series. An analog input signal Sm, which is subjected to sampling with a chip period Tc at a timing m, is commonly inputted to all the correlation computing units F.

Each correlation computing unit Fj is constituted by a multiplier Mj and a code sequence Aj serving as computing means; an adder K1j serving as a first adding means; a quantization circuit Qj serving as a quantizing means; a delay circuit D1j serving as a first delay means; a delay circuit D2j serving as a second delay means; a D/A converter Cj serving as a D/A converting means; an adder K2j serving as a second adding means; a delay circuit D3j serving as a third delay means; and an adder K3j serving as a third adding means.

Here, in the correlation computing unit FN at the final stage, it is also possible to omit the delay circuit D1N and D2N, and the D/A converter CN. In FIG. 1, all the correlation computing units F have the same constructions in order to simplify the design.

Each multiplier Mj multiplies the analog input signal Sm and a coefficient aj to each other. The coefficient aj is previously determined by the code sequence Aj. In the adder K1j, the multiplying result is mutually added by an analog residual signal (mentioned later) from the correlation computing unit Fj−1 of the previous stage and is quantized by the quantization circuit Qj. Here, the analog residual signal inputted to the adder K11 in the correlation computing unit F1 of the first stage is equal to a reference voltage Vref (ground level in FIG. 1).

The quantization circuit Q can be realized by a comparator with 1-bit output, that compares a predetermined reference level and an analog added value. Additionally, the quantization circuit Q can be composed of a comparator with ternary output, that sets the reference level on a positive side and a negative side. Hence, it is possible to achieve a quantization circuit with small bit output and small power consumption.

In the adder K2j realized by a counter and the like, the quantization result of the quantization circuit Qj is mutually added to a quantization result from the adder K2j−1 in the correlation computing unit Fj−1 of the previous stage. The result is delayed by the chip period Tc in the delay circuit D3j, and then, the result is outputted to the adder k2j+1 in the correlation computing unit Fj+1 of the following stage.

When the quantizing circuit Q is a comparator with ternary output as described above, the adder K2 can be realized by an up/down counter. In this case, when the output of the quantization circuit Q is "+1", a count value is incremented. When the output is "−1", the count value is decremented. In the case of "0", no counting operation is carried out.

Further, the quantization result of the quantization circuit Qj is delayed by the chip period Tc in the delay circuit D2j and is inputted to the D/A converter Cj to be converted into an analog signal. In the adder K3j, the output signal of the D/A converter Cj is subtracted from the output of the delay circuit D1j, that is obtained by delaying the output of the adder K1j, so as to form the analog residual signal transmitted to the correlation computing unit Fj+1 of the following stage.

With this arrangement, in view of the digital output from a delay circuit D3j and an analog residual output from an adder K3j, the correlation computing unit F1 of the first stage outputs a partial correlation value of (Sm+1×a1) to an analog input signal Sm+1 at a point m+1. At a point m+2, the partial correlation value in the correlation computing unit F1 of the first stage, that is outputted at the point m+1, is transmitted to a correlation computing unit F2 of the second stage. To an analog input signal Sm+2, the correlation computing unit F2 outputs a cumulative value of the partial correlation values of (Sm+1×a1)+(Sm+2×a2). At the same time, the correlation computing unit F1 of the first stage outputs a partial correlation value of (Sm+2×a1).

At a point m+N−1, a cumulative value of partial correlation values, that is outputted at a point m+N−2, is transmitted to the correlation computing unit FN of the Nth stage, which is the final stage, and the correlation computing unit FN outputs a cumulative value of (Sm+1×a1)+(Sm+2×a2)+ . . . +(Sm+N−1×aN). At the same time, the correlation computing unit F1 of the first stage outputs an partial correlation value of (Sm+N−1×a1), and the correlation computing unit F2 of the second stage outputs a cumulative value of (Sm+N−2×a1)+(Sm+N−1×a2).

Namely, a correlation output Om is always outputted from a digital output part of the correlation computing unit FN of the final Nth stage for every chip period Tc.

With the above construction, the dynamic range of the analog adder K1j is not particularly limited as long as the dynamic range is not saturated to an added value of a) a partial correlation value obtained by the corresponding correlation computing unit Fj and b) the analog signal of the residual from the correlation computing unit Fj−1 of the previous stage. For example, even in the case of a multi-stage construction of N=256 or 512, the circuit size and power consumption of the adder K1 can be reduced, and a cumulative value of partial correlation values can be accurately obtained as a digital output, which is readily processed in the following circuit.

Figure 2:
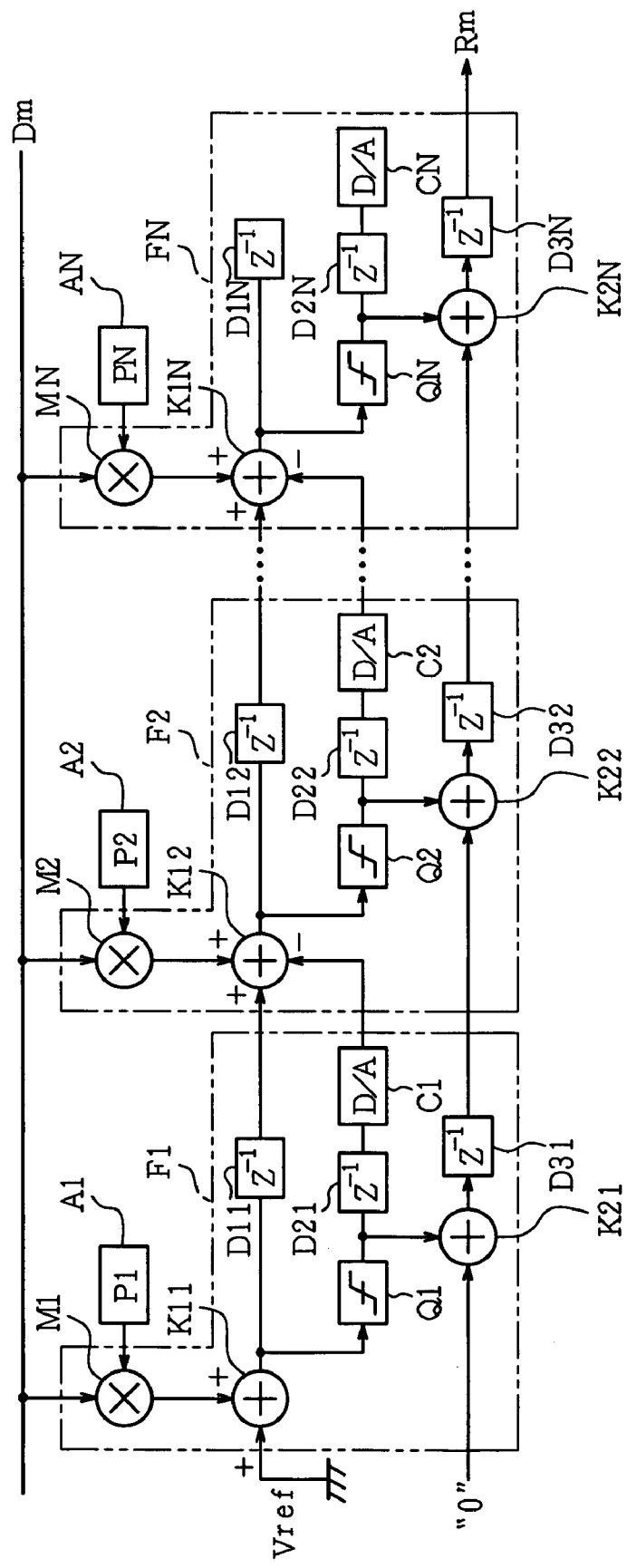
FIG. 2 is a block diagram showing an electric construction of a matched filter according to Embodiment 2 of the present invention.

Referring to FIG. 2, the following explanation describes Embodiment 2 of the present invention.

FIG. 2 is a block diagram showing an electric construction of a matched filter in accordance with Embodiment 2 of the present invention. The matched filter is similar to the FIR filter of FIG. 1. The corresponding members described in Embodiment 1 are indicated by the same reference numerals and the description thereof is omitted. It is noteworthy that an adder K3j-1 serving as a third adding means is functioned by an adder K1j serving as a first adding means. The analog adder K1j realized by an operational amplifier and the like is capable of mutually performing adding and subtracting on 3 or more inputs. The output (analog signal) from the D/A converter Cj−1 is subtracted by the adder K1j so as to obtain the analog residual signal.

Furthermore, the matched filter is used in the spread spectrum receiver to perform a reverse spread, so that the code sequence Aj serves as a spread code generating means. Each of the code sequence Aj stores a spread code Pj and outputs the spread code Pj to the multiplier Mj for every chip period Tc. The spread code Pj is binary of "+1" and "−1"; meanwhile, the coefficient aj can be multiple values. The spread code Pj is a fixed value regardless of the passage of time; however, it is also possible to set a plurality of values and select one of them in order to respond to a communication area.

Moreover, the analog input signal Sm serves as a spread spectrum receive signal Dm, the multiplier Mj serves as a correlation computing circuit for performing a correlation computing on the spread spectrum receive signal Dm and the spread code Pj, and a correlation output Om from the correlation computing unit FN of the final stage serves as a correlation signal Rm. The N stages of the correlation computing unit Fj correspond to the N code lengths of the spread code Pj.

This arrangement makes it possible to reduce the circuit size and power consumption of the adder K1 shown in FIG. 1, and to achieve a fundamental matched filter, which is used in the spread spectrum receiver to perform a reverse spread, by using the FIR filter for accurately obtaining a cumulative value of partial correlation values in a digital output, which is readily processed in the following circuit.

Figure 3:
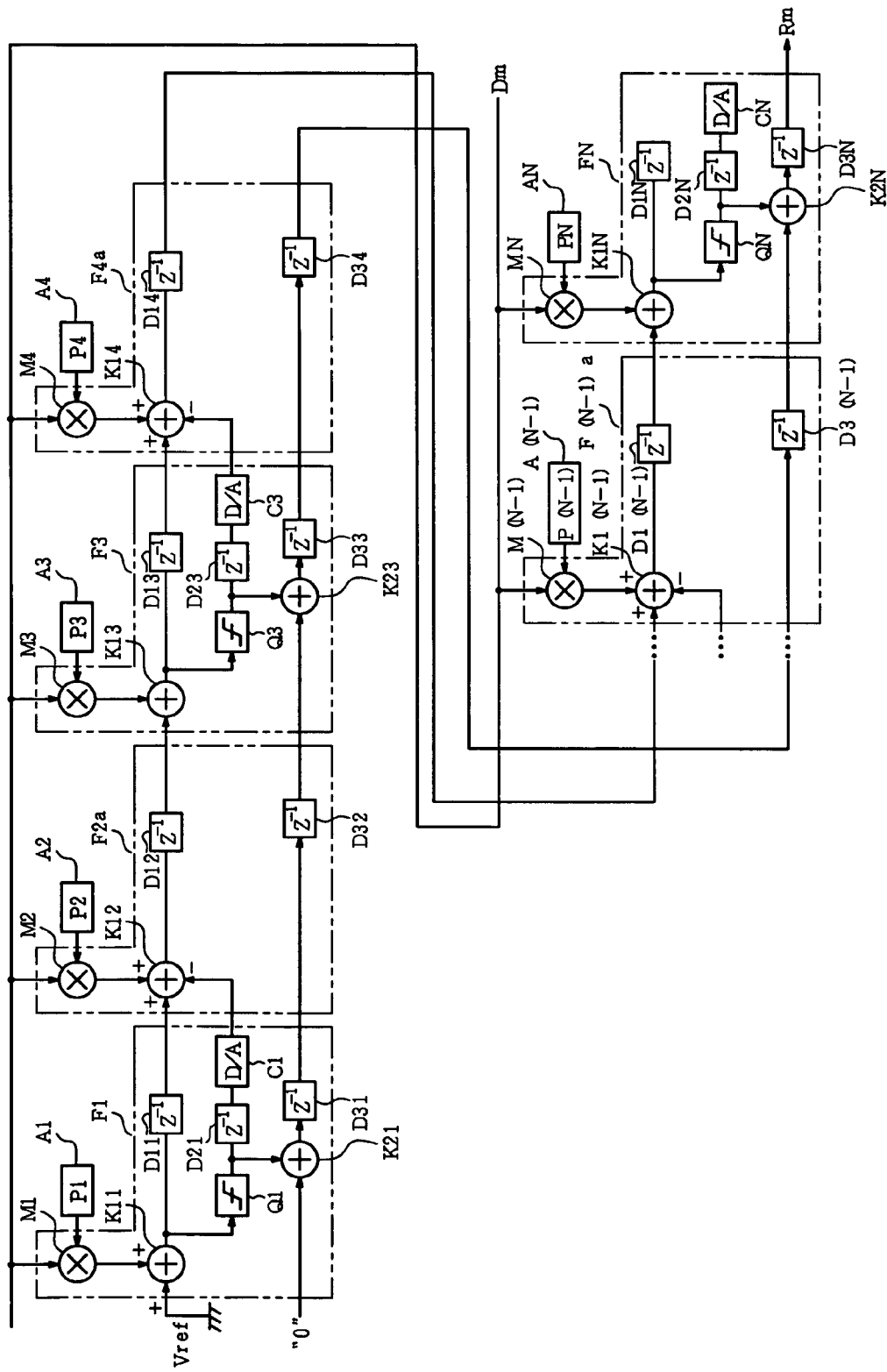
FIG. 3 is a block diagram showing an electric construction of a matched filter according to Embodiment 3 of the present invention.

Referring to FIG. 3, the following explanation describes Embodiment 3 of the present invention.

FIG. 3 is a block diagram showing an electric construction of a matched filter according to Embodiment 3 of the present invention. The matched filter is similar to that of FIG. 2. The corresponding members are indicated by the same reference numerals and the description thereof is omitted. In this matched filter, it is noteworthy that a quantization circuit Qi, a delay circuit D2i, a D/A converter Ci, and an adder K3i are omitted in some correlation computing unit Fi (i=2, 4, ..., N−1). In FIG. 3, the above members are omitted for every other stage of the correlation computing unit Fj, namely, in N/2 stages of the N stages of the correlation computing unit Fj.

In the correlation computing unit F1 in which the members are omitted, a multiplier Mi computes the partial correlation value, an adder K1i adds the partial correlation value to the analog residual signal from the correlation computing unit Fi−1 of the previous stage, the added value is delayed by the chip period Tc in a delay D1i and is outputted, and the quantization result in the correlation computing unit Fi−1 of the previous stage is delayed in a delay D3i and is subjected to a through-output.

The degree of the omitting is determined by resolution required for the correlation signal Rm, so that the members can be omitted for every other stage or every two stage with even intervals, and an FIR filter can have a small coefficient 'a' set for a code sequence A and the possibility of saturation can be small regarding the adder K1.

In this way, it is possible to simplify the construction of the correlation computing unit Fi. Here, a maximum output of cumulative values, that is computed in an adder K2N of the correlation computing unit FN at the final stage, has N counts in the case of FIGS. 1 and 2, in which the members are not omitted. In this case, omitting every other stage results in N/2 counts and omitting every two stages results in N/3 counts, thereby reducing the resolution of the cumulative values. Therefore, the members are evenly omitted according to the resolution of the required output so as to satisfy the required function (resolution) with a minimum circuit construction.

Figure 4:
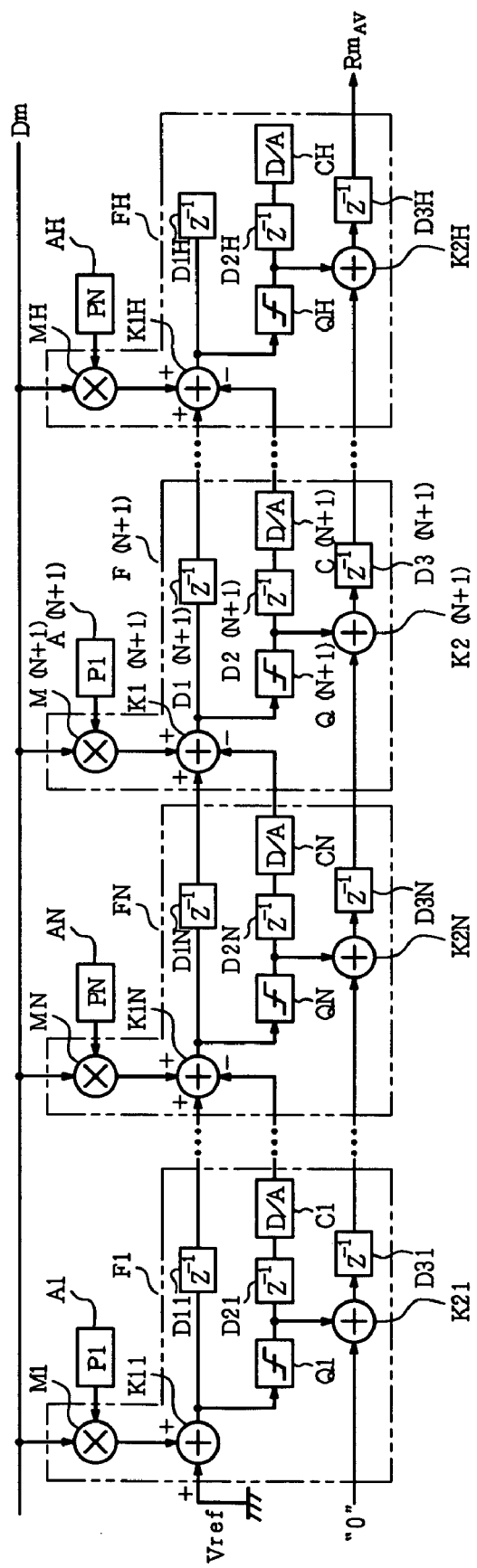
FIG. 4 is a block diagram showing an electric construction of a matched filter according to Embodiment 4 of the present invention.

Referring to FIG. 4, the following explanation describes Embodiment 4 of the present invention. FIG. 4 is a block diagram showing an electric construction of a matched filter according to Embodiment 4 of the present invention. The matched filter is similar to that of FIG. 2. The corresponding members are indicated by the same reference numerals and the description thereof is omitted. It is noteworthy that the matched filter is provided with H= N×ø (ø is an integer of two or more) correlation units Fh (h=1, 2, ..., N−1, N, N+1, ..., H−1, H). The spread code Pn is repeated for ø times, a code sequence Ah can be provided for each of the correlation computing units Fh, namely, for each of H taps, and the code sequence Ah can be provided for each of the spread code Pn, namely, can be shared by the ø correlation computing units.

In such a matched filter, the correlation output Rm is summed and averaged by ø times larger than one symbol period (one period of PN code). In other words, at a point m+H, a correlation computing unit F1 of the first stage outputs a partial correlation value of (Dm+H*P1), a correlation computing unit F2 of the second stage outputs a cumulative value of (Dm+H−1*P1)+(Dm+H*P2), and a correlation computing unit FH of the final H stage outputs a cumulative value of (Dm+I*P1)+(Dm+2*P2)+ ... +(Dm+N*PN)+(Dm+N+1*P1)+ ... +(Dm+H−1*PN−1)+(Dm+H*PN).

Namely, from a digital output part of the correlation computing unit FH at the final H stage, a summed and averaged correlation output $Rm_{Av}$ is outputted for every chip period Tc. Therefore, computing accuracy of a correlation value can be improved so as to accurately and promptly carry out synchronization of spread spectrum communication.

Figure 5:
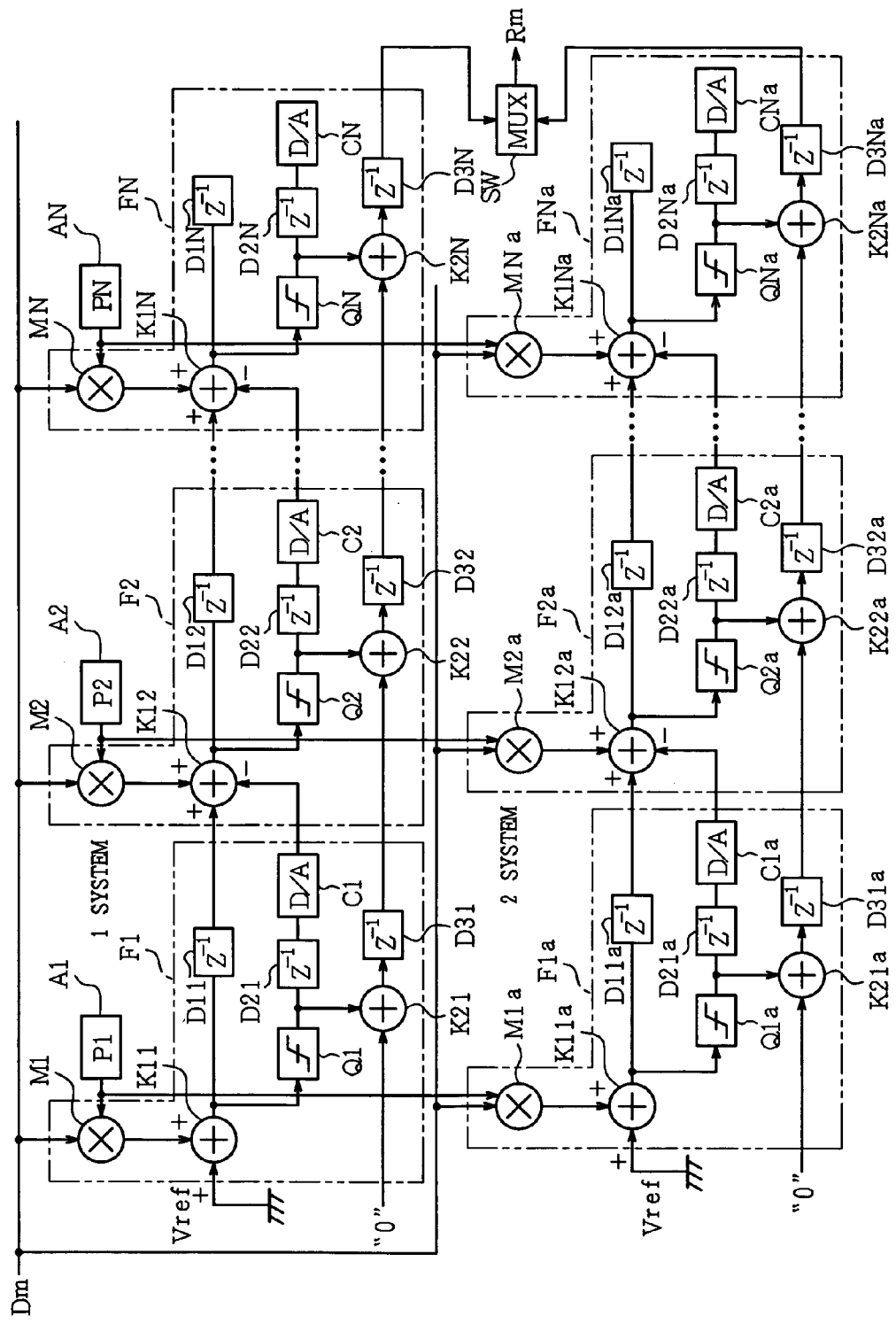
FIG. 5 is a block diagram showing an electric construction of a matched filter according to Embodiment 5 of the present invention.

FIG. 5 is a block diagram showing an electric construction of a matched filter according to Embodiment 5 of the present invention. The matched filter is similar to that of FIG. 2. The corresponding members are indicated by the same reference numerals and the description thereof is omitted. In this matched filter, it is noteworthy that the correlation computing unit includes two systems of a first system indicated by reference numeral Fj and a second system indicated with a subscript 'a', that perform a two-time larger oversampling. The construction of the second system is identical to that of the first system. The construction elements in each correlation computing unit Fja of the second system are indicated with the subscript 'a' to the same reference numerals as those of the corresponding correlation computing unit Fj of the first system. Here, needless to say, the times K of the oversampling are not particularly limited to 2 of FIG. 5 and other values are also applicable.

A code sequence Aj is shared between correlation computing units Fj and Fja, that use the common spread code with the same number of stages. Further, the correlation computing unit Fj of the first system and the correlation computing unit Fja of the second system receive respective clock signals, each having a phase shifted from each other by Tc/K. Of correlation computing units FN and FNa at the final stage, in response to the clock signals, a multiplexer SW selects a correlation value from the correlation computing unit on the system, in which a spread spectrum receive signal Dm undergoes a sampling so as to compute the correlation value, and then, the correlation value is outputted as the correlation signal Rm.

With this arrangement, even when the correlation computing units Fj and Fja of the systems perform correlation computing at a low speed of every chip period Tc, it is possible to obtain a highly accurate computing result by K-time oversampling.

Figure 6:
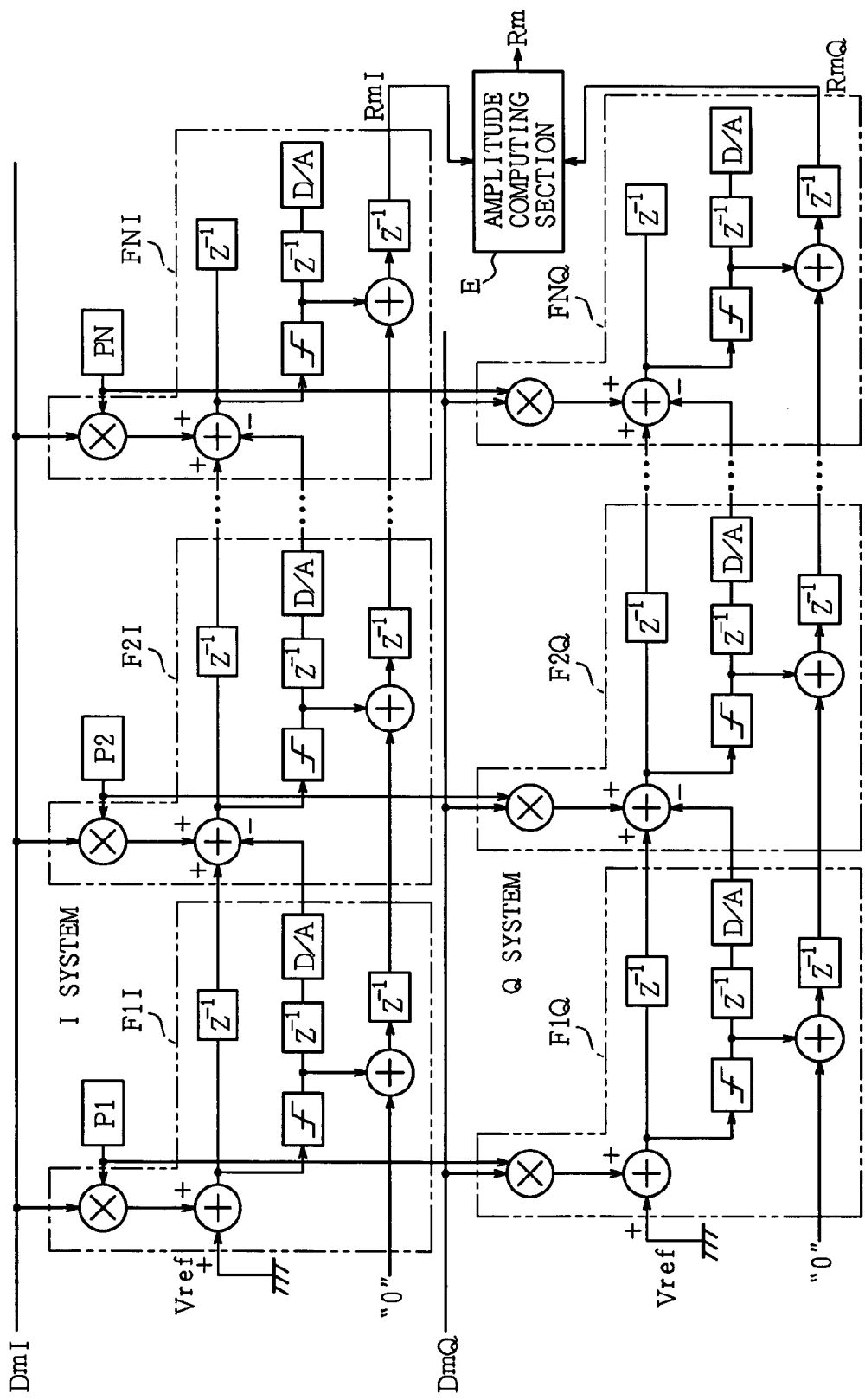
FIG. 6 is a block diagram showing an electric construction of a matched filter according to Embodiment 6 of the present invention.

Referring to FIG. 6, the following explanation describes Embodiment 6 of the present invention.

FIG. 6 is a block diagram showing an electric construction of a matched filter according to Embodiment 6 of the present invention. The matched filter is similar to that of FIG. 5. In this matched filter, the correlation computing unit Fj of the first system receives an I signal component DmI of a spread spectrum receive signal Dm, that is indicated by a reference numeral FjI. The correlation computing unit Fja of the second system receives a Q signal component DmQ of a spread spectrum receive signal Dm, that is indicated by a reference numeral FjQ. The correlation computing units FjI and FjQ receive the same clock signal. Regarding correlation signals RmI and RmQ from the correlation computing units FjI and FjQ of the systems, an amplitude value is computed by the square root of the sum of squares or by an approximate value, and the amplitude value is outputted as an amplitude correlation output of the matched filter at that point for every chip period Tc.

In this way, the complex matched filter can be achieved.

To allow the complex matched filter to respond to oversampling, it is possible to adopt the method shown in FIG. 5 regarding the correlation computing unit FjI of the system receiving the I signal component DmI, and the correlation computing unit FjQ of the system receiving the Q signal component DmQ.

Figure 7:
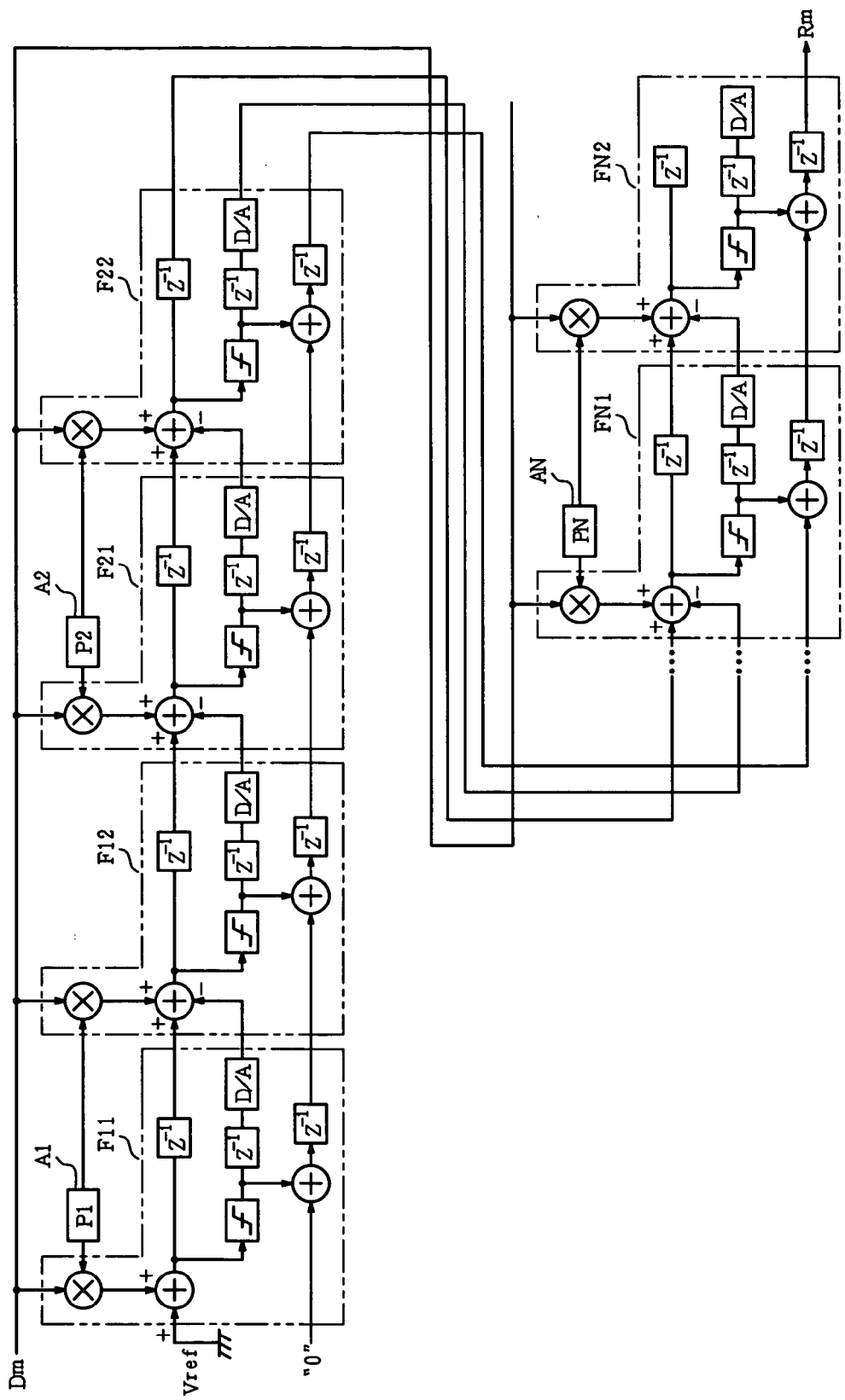
FIG. 7 is a block diagram showing an electric construction of a matched filter according to Embodiment 7 of the present invention.

Referring to FIG. 7, the following explanation describes Embodiment 7 of the present invention.

FIG. 7 is a block diagram showing an electric construction of a matched filter according to Embodiment 7 of the present invention. The matched filter performs K-time (K=2 in FIG. 7) oversampling, and the fundamental construction is based on the matched filter shown in FIG. 2. The code sequence Aj outputs a spread code Pj for every chip period Tc. N×K correlation computing units are provided and are indicated by Fj1, Fj2, . . . , FjK for every spread code Pj. The units are connected in series.

Furthermore, in the same manner as the matched filter of FIG. 5, the correlation computing units Fj1, Fj2, . . . FjK receive clock signals, each having a phase shifted from the previous one by Tc/K. Therefore, when the correlation computing unit Fj1 performs correlation computing at point m, the correlation unit Fj2 performs correlation computing at point m+1, which is Tc/K after the point m.

This arrangement makes it possible to output the correlation signal Rm from a correlation computing unit FNK of the final stage with 1/K of the chip period Tc, without the necessity for the multiplexer SW. Further, since oversampling is added, for example, a digital added value increases by one bit in the case of K=2, and the value increases by 2 bits in the case of K=4. Hence, it is possible to accurately compensate for synchronization of a spread spectrum receive signal.

Figure 8:
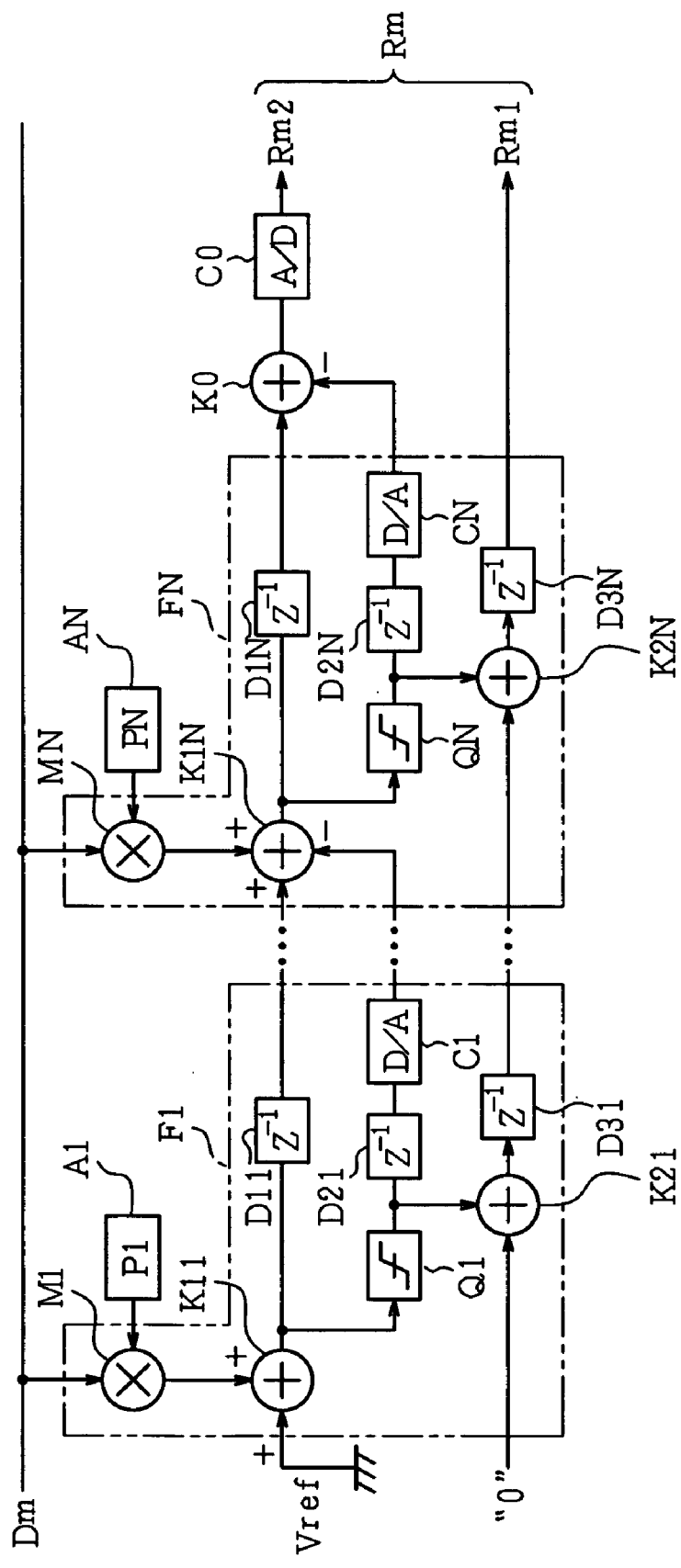
FIG. 8 is a block diagram showing an electric construction of a matched filter according to Embodiment 8 of the present invention.

Referring to FIG. 8, the following explanation describes Embodiment 8 of the present invention.

FIG. 8 is a block diagram showing an electric construction of a matched filter according to Embodiment 8 of the present invention. The matched filter is similar to that of FIG. 2. The matched filter is devised for obtaining a correlation signal Rm with high accuracy by using an analog residual which remains in a correlation computing unit FN of the final stage.

The output from a D/A converter CN of the correlation computing unit FN at the final stage is subtracted from a partial correlation value transmitted via a delay circuit D1N of the correlation computing unit FN, in an adder K0 serving as a fourth adding means, and then, the output undergoes A/D conversion in an A/D converter CO serving as an A/D converting means with high resolution. Therefore, a correlation output Rm1 and a correlation output Rm2 serve as the correlation output Rm. The correlation output Rm1 corresponds to the higher significant bits of a delay circuit D3N of the correlation computing unit FN at the final stage, and the correlation output Rm2 corresponds to the lower significant bits of the A/D converter CO. In this way, the correlation output Rm can be obtained with high accuracy.

Figure 9:
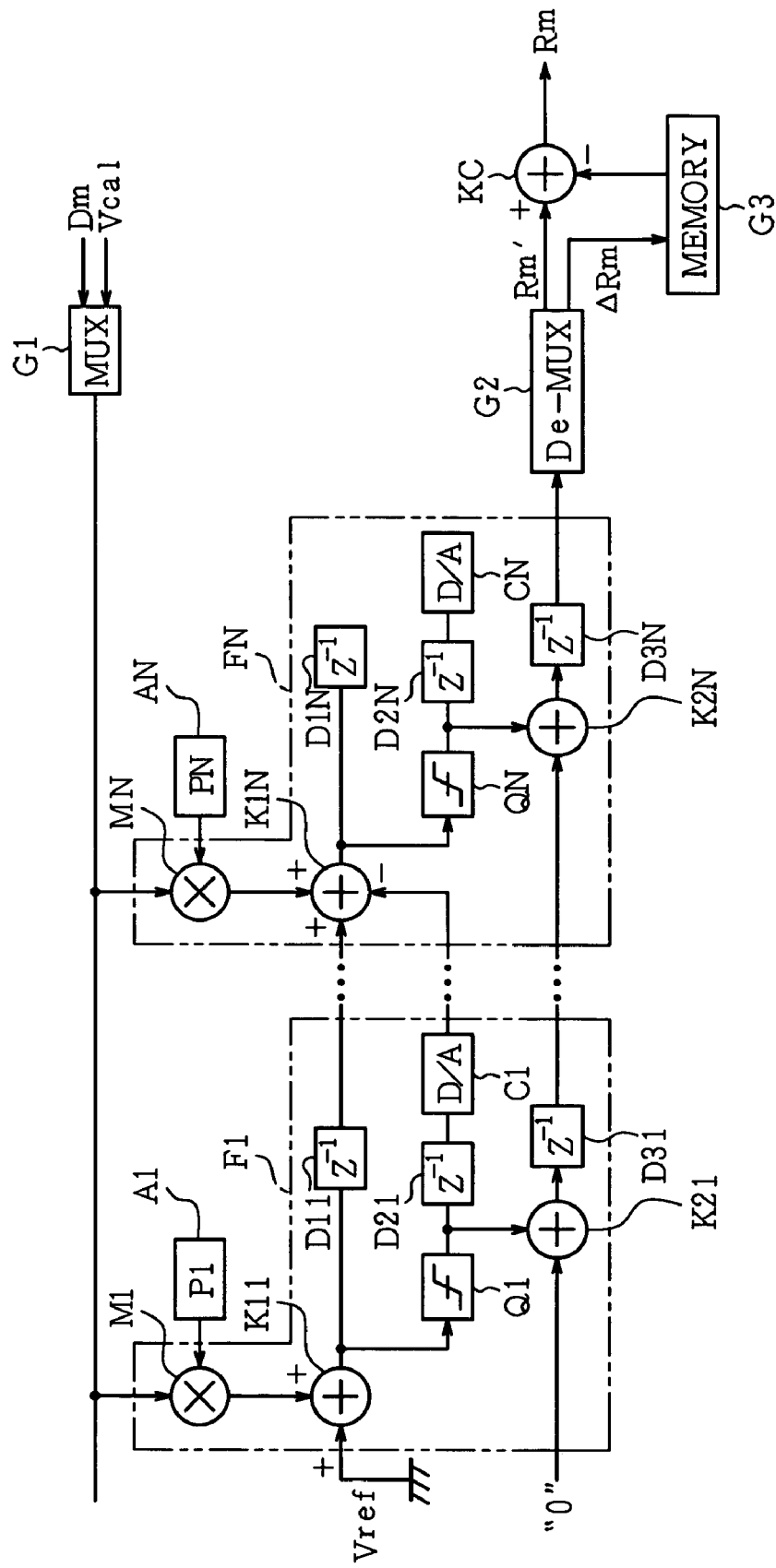
FIG. 9 is a block diagram showing an electric construction of a matched filter according to Embodiment 9 of the present invention.

Referring to FIG. 9, the following explanation describes Embodiment 9 of the present invention.

FIG. 9 is a block diagram showing an electric construction of a matched filter according to Embodiment 9 of the present invention. The matched filter is similar to that of FIG. 2. The matched filter is devised for correcting a DC offset.

Thus, a multiplexer G1 serving as a first switching means is provided via a signal line, which supplies a spread spectrum receive signal Dm to a multiplier Mj of a correlation computing unit Fj, and a multiplexer G2 serving as a second switching means is provided via an output line, which is extended from a delay circuit D3N of a correlation computing unit FN at the final stage. Further, a memory G3 is provided for storing the DC offset ΔRm, an adder KC serving as a fifth adding means is provided for subtracting the DC offset ΔRm from a correlation output Rm', which includes the DC offset ΔRm transmitted from the delay D3N.

The operation includes a calibration mode for measuring a DC offset of the matched filter and a correlation computing mode for measuring a correlation output. In the calibration mode, the multiplexer G1 performs correlation computing in a state in which instead of the spread spectrum receive signal Dm, a reference voltage $V_{CAL}$ serves as an input signal of the multiplier Mj, and an output value thereof is stored as the DC offset ΔRm in the digital memory G3 via the multiplexer G2. Theoretically, the correlation output is set at 0 when an input is the reference voltage $V_{CAL}$, and it is understood that the correlation output is the DC offset ΔRm in this case.

In the correlation computing mode, the multiplexer G1 performs correlation computing in a state in which the spread spectrum receive signal Dm serves as an input signal of the multiplier Mj, a correlation output Rm' is supplied to the adder KC via the multiplexer G2, and the DC offset ΔRm is subtracted by the adder KC. In this way, the correlation output Rm can be obtained with high accuracy while removing the DC offset ΔRm.

Here, the adder K2j for cumulating the partial correlation values does not need to be identical to one another. In the case of N=256, an adder 21 is realized by a one-bit counter, adders K22 and K23 are realized by two-bit counters, adders K24 to K27 are realized by three-bit counters, adders K28 to K215 are realized by four-bit counters, adders K216 to K231 are realized by five-bit counters, adders K232 to K263 are realized by six-bit counters, adders K264 to K2127 are realized by seven-bit counters, adders K2128 to K2255 are realized by eight-bit counters, and an adder K2256 is realized by a nine-bit counter.

In this arrangement, the required total number of the flip flops is indicated as below.

(1 bit+2×2 bit+4×3 bit+8×4 bit+16×5 bit+32×6 bit+64×7 bit+128×8 bit+9 bit)×2=3604

Meanwhile, when all the adders K21 to K2256 are realized by nine-bit counters, the required total number of the flip flops is indicated as below.

(256×9 bit)×2=4608

Hence, it is possible to reduce the total number of the flip flops by 22%.

Furthermore, regarding the constructions of the matched filters shown in FIGS. 2 to 9, "1" is set in all the code sequences A1 to AN in free time, in which the matched filter does not perform synchronous compensation, so that (Sm+1+ Sm+2+ . . . +Sm+N−1) is outputted as the correlation output Rm at point m+N−1. Namely, an A/D converted value, which is a moving average of N sampling values, is outputted for every chip period Tc.

Figure 10:
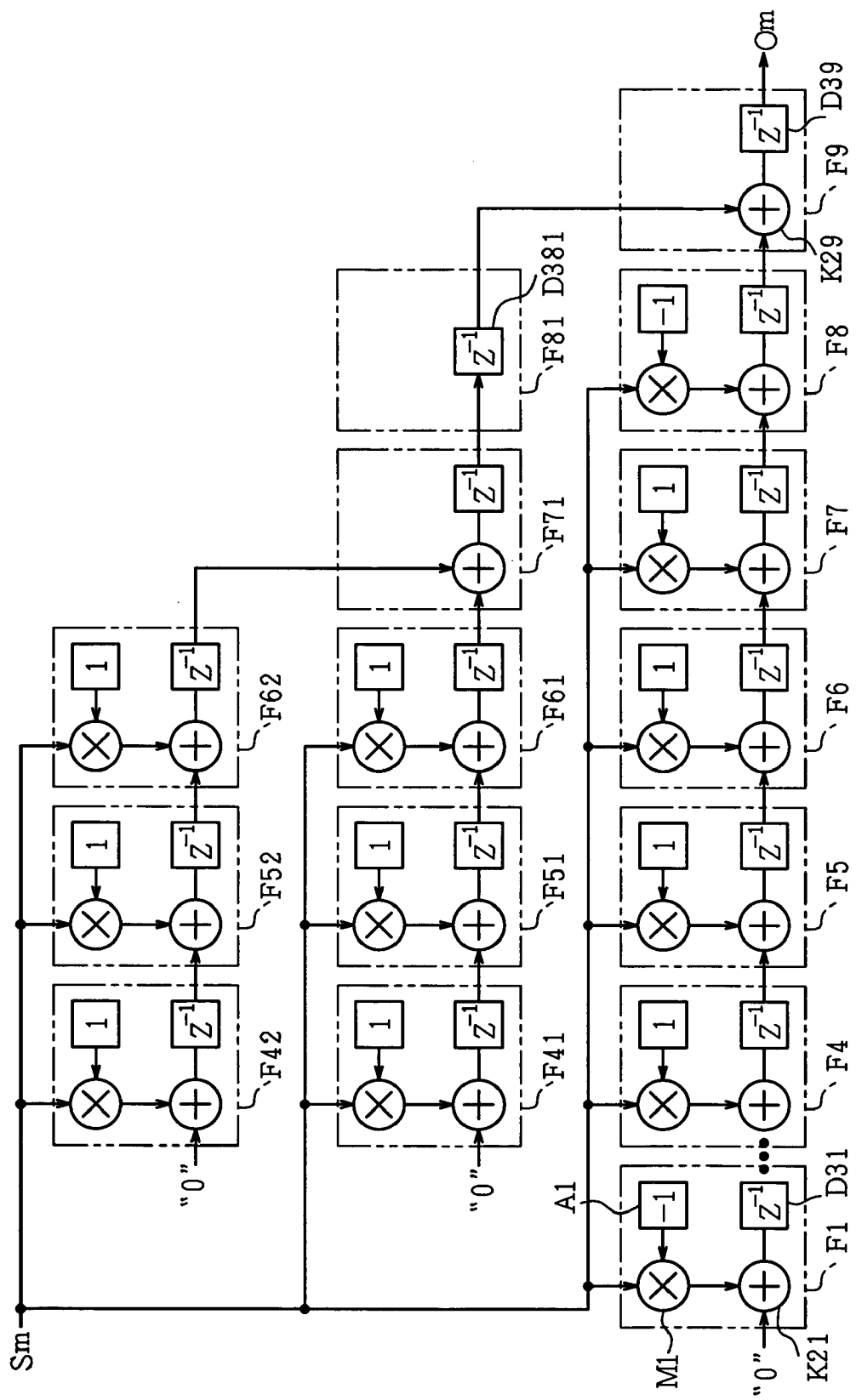
FIG. 10 is a block diagram showing an electric construction of an FIR filter according to Embodiment 10 of the present invention.
Figure 11:
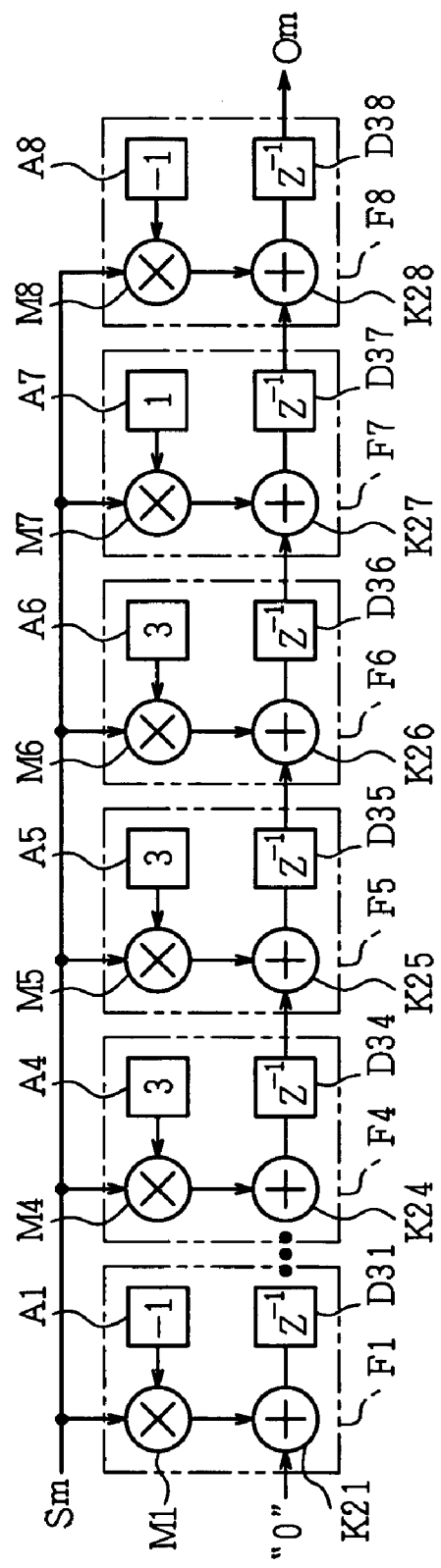
FIG. 11 is a block diagram showing a prototype of the FIR filter shown in FIG. 10.
Figure 12:
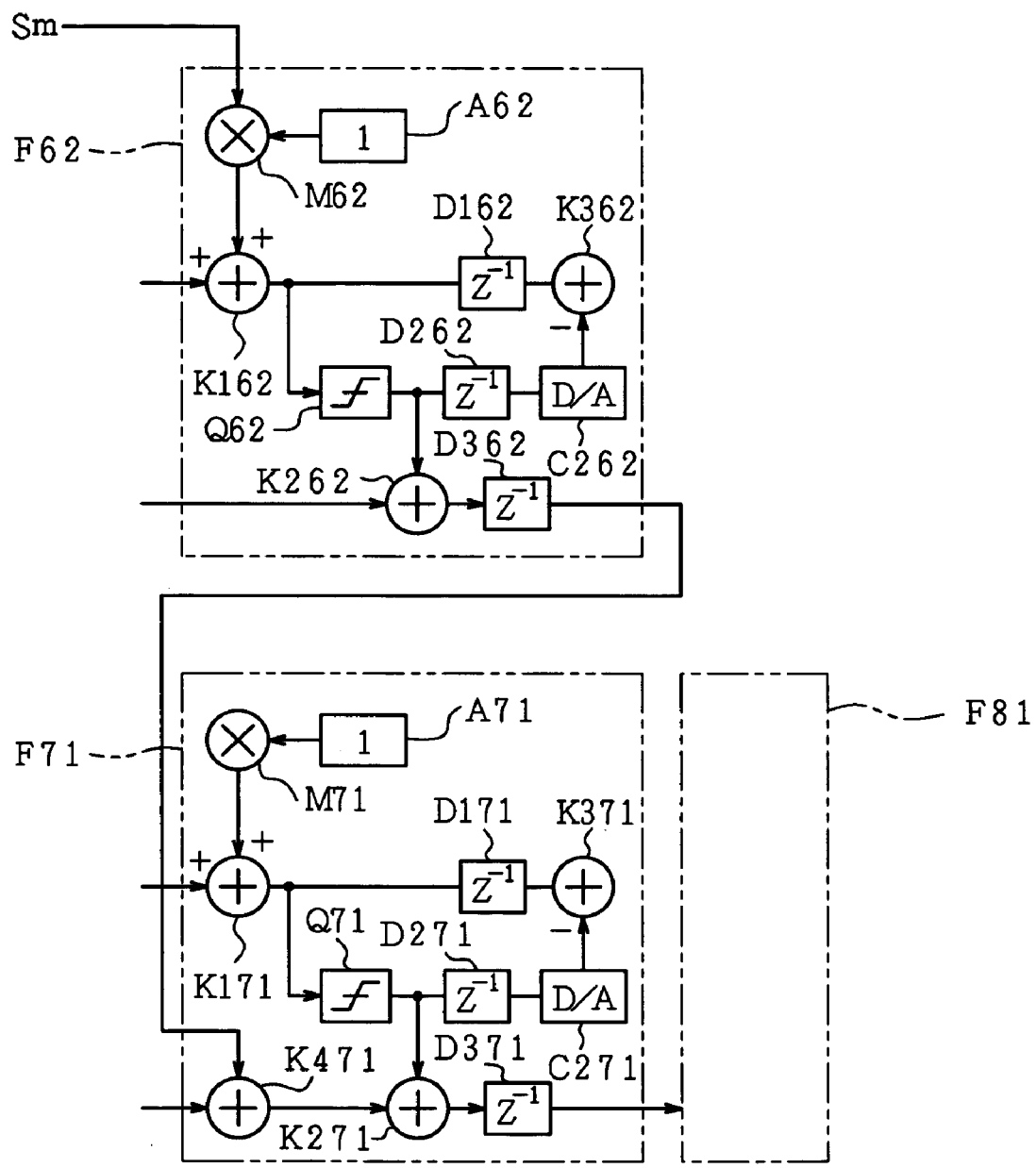
FIG. 12 is a block diagram showing a construction example of a unit in the FIR filter shown in FIG. 10.

Referring to FIGS. 10 to 12, the following explanation describes Embodiment 10 of the present invention.

FIG. 10 is a block diagram showing an electric construction of an FIR filter according to Embodiment 10 of the present invention. The FIR filter is used as a band limitation filter which is adopted for a converting section of a receive signal in a communication receiver, and the number of stages of the correlation unit F is about 10 to 20. Here, to simplify the figure, FIG. 10 shows that each correlation computing unit F includes a multiplier M and a code sequence A serving as computing means, an adder K2 serving as a second adding means, and a delay circuit D3 serving as a third delay means, as representative members.

It is noteworthy that correlation computing units Fj at a plurality of j stages (8 in FIG. 10), that are connected in series, partially form a plurality of columns (3 in FIG. 10). As shown in FIG. 11, to achieve the band limitation filter, the FIR filter needs to set a coefficient "3" for correlation computing units F4 to F6 in a series circuit ranging from a correlation computing unit F1 of the first stage to a correlation computing unit F8 at the final eighth stage; meanwhile, F41 and F42 are provided in parallelly connected with the correlation unit, F51 and F52 are provided in parallelly connected with the correlation computing unit F5, F61 and F62 are provided in parallelly connected with the correlation computing unit F6, and each of the units has a coefficient of "1". In other words, an added value of coefficients at the corresponding stage is divided by the paralleled correlation computing units F4, F41, F42; F5, F51, F52; and F6, F61, F62 so as to be set at a desirable value for each stage.

An analog input signal Sm is applied to the added correlation computing units F41, F42; F51, F52; F61, F62 in the same manner as the correlation computing units F1 to F8. The analog input signal Sm is inputted before computing to the correlation computing units F41 and F42 at the same sampling timing as F4; the correlation computing units F51 and F52 at the same sampling timing as F5; and the correlation computing units F61 and F62 at the same sampling timing as F6.

Units F71 and F9 are provided for joining the computing results of the divided parallelly connected circuits, and a unit F81 is provided for adjusting timing. In other words, the unit F81 is composed of the delay circuit D381 for adjusting timing. The unit F9 is composed of an adder K29 for adding a) a digital output from the delay circuit D381 of the unit F81 and b) a digital output from the correlation unit F8 of the previous stage, and a delay circuit D39.

FIG. 12 is a block diagram showing a construction example of the unit F71. The construction of the correlation computing unit F62 is similar to the other correlation computing units F42, F52; F1 to F8, and others. In the unit F71, the digital output from the delay circuit D362 is beforehand added to a digital output from the previous correlation computing unit F61, in an adder K471 provided at the previous stage of an adder K271, and then, the output is inputted to the adder K271. The adder K271 is provided for adding a) a digital output from the delay D361 (not shown) of the correlation computing unit F61, which belongs to the previous stage, and b) a quantization result of a quantization circuit Q71.

With this arrangement, it is possible to reduce a dynamic range of the adders K14 to K16 for adding an analog computing result at the present stage and an analog residual of the previous stage in the correlation computing units F4 to F6. Namely, when the adders K14 to K16 have the same constructions as the other adders K11 to K13; K17, K18 relative to the coefficient "3", saturation may occur. Particularly, in the case of a series of large coefficients such as the correlation computing units F4, F5, and F6, the likelihood is increased. For this reason, when the adders K11 to K13; K17, K18 have a dynamic range of 1, it is necessary to set a dynamic range of the adders K14 to K16 at 3.

For instance, an adder with a dynamic range of 3 requires power consumption of 3 to 5 times larger than an adder with a dynamic range of 1. Thus, as compared with the adders K14 to K16, it is possible to reduce the total power consumption even when considering the adders K141 to K161; K142 to K162 (K141 to K161; K142 to K152 are not shown) in the correlation computing units F41 to F61; F42 to F62, that are divided in parallelly connected with each other. Therefore, even in the case of a large coefficient, the above parallelly connected circuit construction is capable of reducing power consumption.

The coefficient is not limited to "3". It is possible to select any number larger than the coefficients of the other correlation computing units F1 to F3; F7, F8. In this case, the number is divided by the coefficient of the correlation computing units F1 to F3; F7, F8 (in the case of a remainder, the number is advanced), so as to achieve evenly small dynamic ranges of the adders K1 in all the correlation computing units F.

The unit F71 is arranged so as to be identical to the correlation computing units F1 to F8; F41 to F61 and others except for the adder K471 in order to standardize the circuit construction and to simplify the design. However, the unit F71 is also allowed to include adders and delay circuits as the unit F9.

Figure 13:
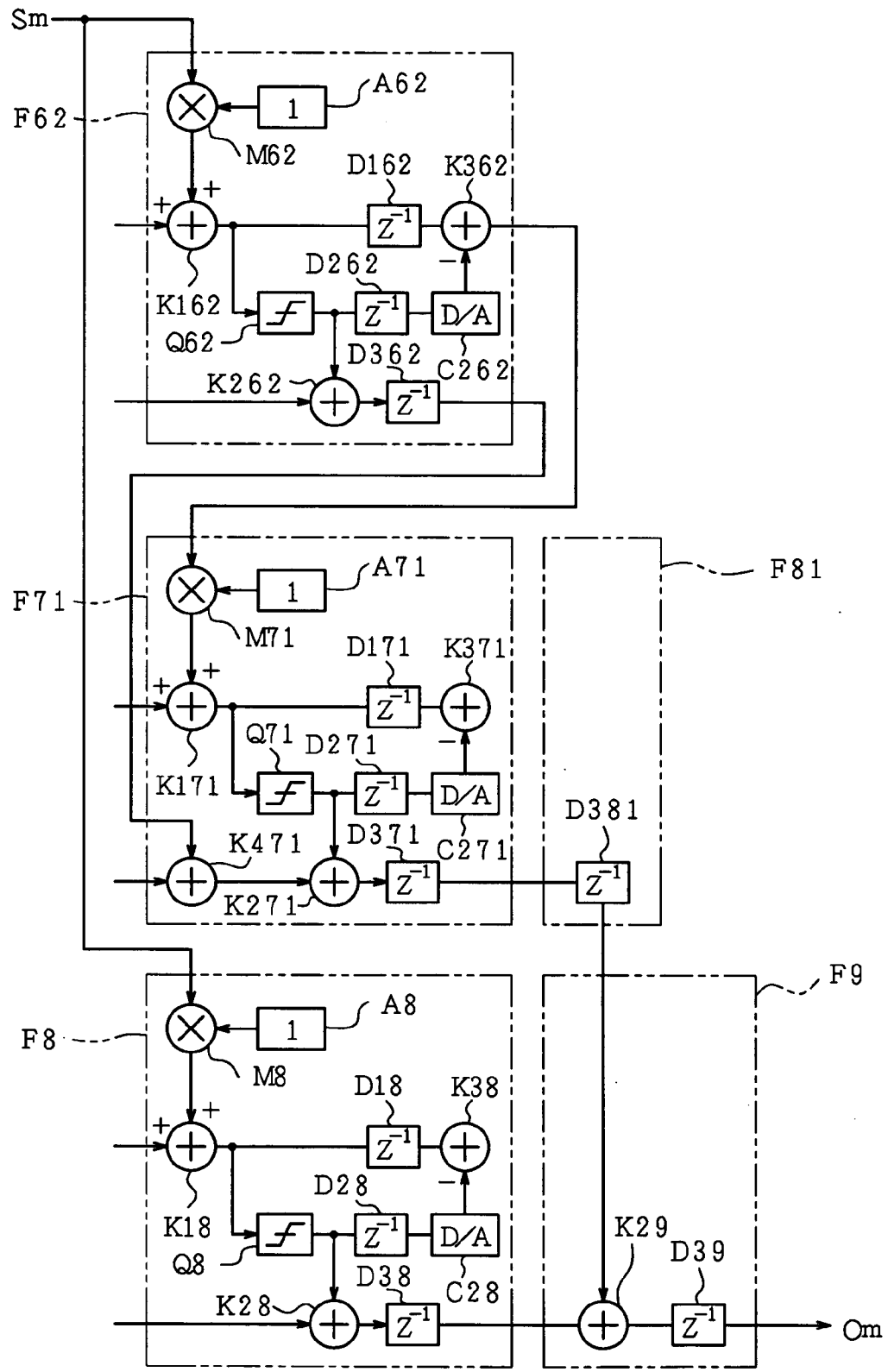
FIG. 13 is a block diagram showing another construction example of the unit according to Embodiment 11 of the present invention.
Figure 14:
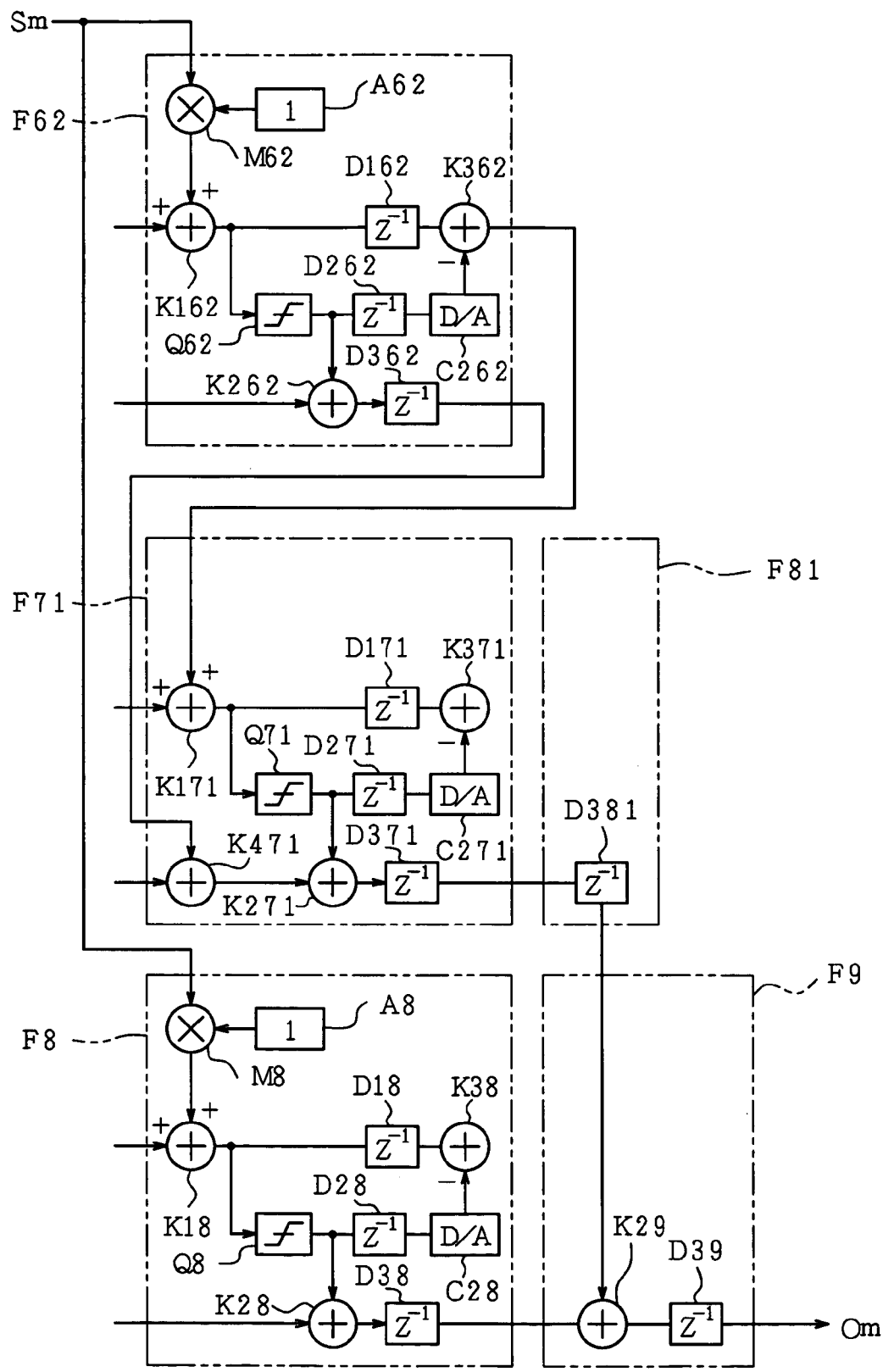
FIG. 14 is a block diagram showing another construction example of the unit shown in FIG. 14.

Referring to FIGS. 13 and 14, the following explanation describes Embodiment 11 of the present invention.

FIG. 13 is a block diagram showing another construction example of the unit F71. An analog residual output from an adder K362 of a correlation computing unit F62 is inputted to a multiplier M71 of the unit F71, that is provided for performing adding. The inputted analog residual is multiplied by a coefficient "1", which is set for the code sequence A71, and then, the residual is added to an analog residual output transmitted from a correlation computing unit 61 of the previous stage, in an adder K171. A digital output is added in an adder K471 in the same manner as the construction of FIG. 12. The unit F9 is also allowed to add an analog residual as well as a digital output from a unit F81, in the same manner as the unit F71.

Further, FIG. 14 is a block diagram showing still another construction example of the unit F71. The construction is similar to that of FIG. 13, so that the corresponding members are indicated by the same reference numerals and the description thereof is omitted. In this example, the coefficient of the code sequence A71 is "1", so that the multiplier M71 and the code sequence A71 are not provided and an analog residual output from an adder K362 of the correlation computing unit F62 is directly inputted to an adder K171.

It is possible to select any one of the constructions shown in FIGS. 12 to 14. In order to reduce the likelihood of overflow in the adder K171 and to be equal to the dynamic range of the adder K171 with those of the other adders K11 to K18 and others, the construction of FIG. 12 is applicable. When the likelihood of overflow is small and an analog residual is considered, the constructions of FIGS. 13 and 14 are applicable. And then, the construction of FIG. 14 is applicable for a simpler circuit construction, and the construction of FIG. 13 is applicable for a uniform circuit construction and a simpler arrangement.

Figure 15:
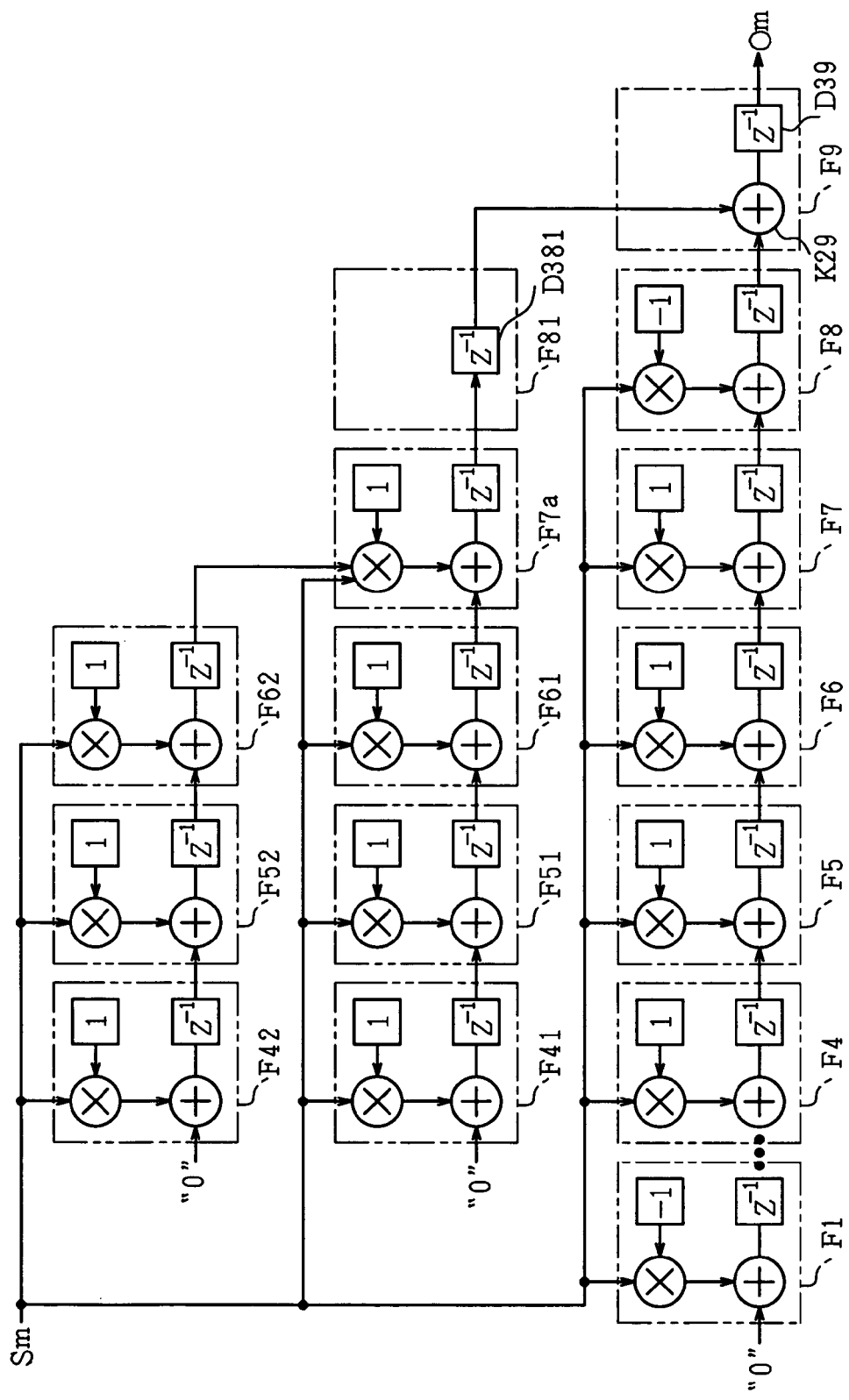
FIG. 15 is a block diagram showing an electric construction of an FIR filter according to Embodiment 12 of the present invention.
Figure 16:
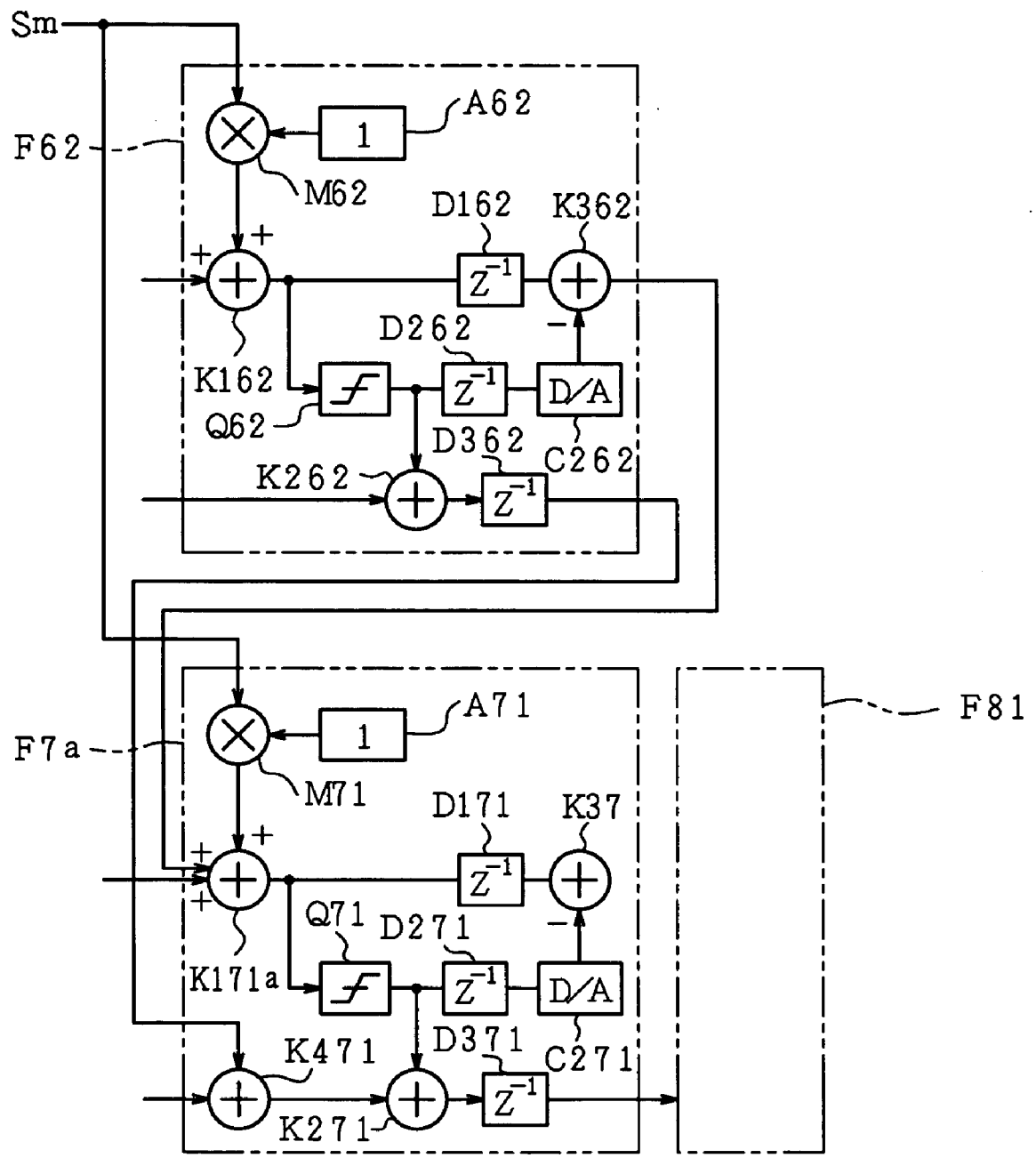
FIG. 16 is a block diagram showing a construction example of a correlation computing unit in the FIR filter of FIG. 15.

Referring to FIGS. 15 and 16, the following explanation describes Embodiment 12 of the present invention.

FIG. 15 is a block diagram showing an electric construction of an FIR filter according to Embodiment 12 of the present invention. The filter is similar to that of FIG. 10, so that the corresponding members are indicated by the same reference numerals. It is noteworthy that joining is carried out in a correlation computing unit Fa which performs correlation computing. The correlation computing unit Fa has a coefficient of "1", so that a correlation computing unit F7 originally has a coefficient of "2".

FIG. 16 is a block diagram showing a construction example of the correlation computing unit Fa. The correlation computing unit Fa is similar to the unit F71. An adder K171a of the correlation computing unit Fa mutually adds a) an analog residual output from an adder K361 (not shown) of the correlation computing unit F61 of the previous stage, b) an analog computing result at an adder M71, and c) an analog residual output from an adder K362 of a correlation computing unit F62.

With this arrangement, even when a large coefficient is demanded at a relatively front stage and a parallelly connected construction is required in a filter having a relatively large number of cascade stages like the matched filter, joining is possible at a desired stage and delay circuits do not need to be connected to the final stage. Consequently, it is possible to achieve a relatively small circuit construction.

Figure 17:
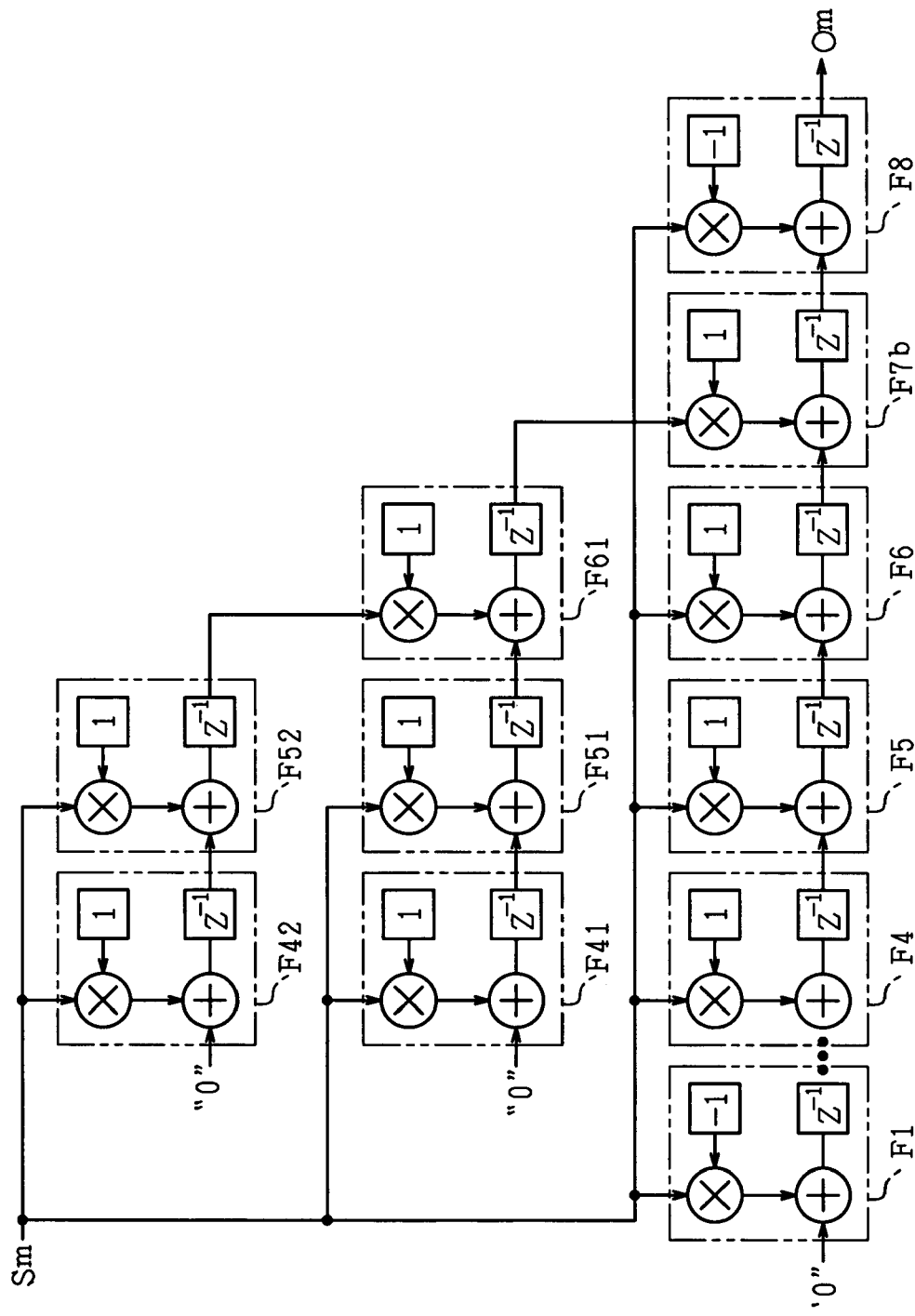
FIG. 17 is a block diagram showing an electric construction of an FIR filter according to Embodiment 13 of the present invention.

Referring to FIG. 17, the following explanation describes Embodiment 13 of the present invention.

FIG. 17 is a block diagram showing an electric construction of an FIR filter according to Embodiment 13 of the present invention. The filter is similar to those of FIGS. 10 and 15, so that the corresponding members are indicated by the same reference numerals. It is noteworthy that the FIR filter has a correlation computing unit Fb, in which a multiplying result is always 0 relative to an arbitrary analog input signal Sm. This characteristic is utilized in the present embodiment. Namely, assuming that a multiplying coefficient of the correlation computing unit Fb is 1, an analog residual from a unit F61 of the other column is inputted instead of the analog input signal Sm, and is added to an analog residual from the previous stage.

A unit F71 of FIG. 13 or 14 can be used as the correlation computing unit Fb. When a correlation computing unit having a multiplying coefficient of 0 is not provided right after a unit F61 at the final stage of a parallel circuit, it is possible to adopt a correlation computing unit having a multiplying coefficient of 0 at the following stage, for example, by connecting delay circuits in series.

With this arrangement, an adder K171 of the correlation computing unit Fb to be joined needs to mutually add a multiplying result of the present stage, an analog residual from the previous stage, and a joining analog residual. Thus, in the case of the same dynamic range as those of adders at the other stages, overflow may occur. Meanwhile, the aforementioned arrangement has a multiplying coefficient of 0, so that the likelihood of overflow can be eliminated in the same manner as ordinary correlation units F1 to F6, and F8, only by mutually adding an analog residual from the previous stage and a joining analog residual.

As described above, a filter circuit of the present invention, in which a plurality of unit circuits are mutually connected in series, a computing means in each of the unit circuits successively transmits to a unit circuit of the following stage a computing result of a) an analog input signal sampled at the same sampling timing and b) a coefficient predetermined for each of the computing means, the computing means mutually adds the computing results of the present stage and its previous stage so as to compute in a unit circuit of the final stage a cumulative value of computing results of all the coefficients and time-series analog sampling signals whose number corresponds to that of the coefficients, and the cumulative value is outputted as digital data, is characterized in that low-bit quantization is subjected to an added value of an output from a unit circuit of the previous stage and a computing result of the present stage, in an arbitrary unit circuit other than the final stage, and the quantization result and a residual, the residual being obtained by subtracting a D/A converted value of the quantization result from the added value, are successively transmitted to the following unit circuit.

Moreover, as described above, a filter circuit of the present invention, in which a plurality of unit circuits are mutually connected in series, a computing means in each of the unit circuits successively transmits to a unit circuit of the following stage a computing result of a) an analog input signal sampled at the same sampling timing and b) a predetermined coefficient for each of the computing means, the computing means mutually adds the computing results of the present stage and its previous stage so as to compute in a unit circuit of the final stage a cumulative value of computing results of all the coefficients and time-series analog sampling signals whose number corresponds to that of the coefficients, and the cumulative value is outputted as digital data, is characterized in that the computing result of the present stage is added to a cumulative value of the previous stage by an adding means, the added value is subjected to low-bit quantization by an arbitrary unit circuit other than the final stage and is successively transmitted to the following unit circuit, a D/A converted value of the quantization result is subtracted from the added value so as to suppress an increase in a dynamic range of an adding means in a unit circuit of the following stage.

According to this arrangement, each of the unit circuits computes a partial correlation value, a computing result is subjected to low-bit quantization in a unit circuit at an arbitrary stage in which a cumulative value of the partial correlation values exceeds a predetermined value, and a quantization result and an analog signal are successively outputted to the following stage, the analog signal corresponding to a residual obtained by subtracting an analog converted value of the quantization result from the cumulative value.

Therefore, a dynamic range of the adding means for computing the cumulative value only needs to be set such that no saturation occurs on an added value of a) a partial correlation value obtained in each of the unit circuits and b) an analog signal of the residual from the unit circuit of the previous stage. Even in the case of a multi-stage construction with 256 or 512 stages for a matched filter, it is possible to reduce the circuit size and power consumption of the adding means. Without the necessity for a high-speed A/D digital converter with high resolution, it is possible to accurately obtain a cumulative value of partial correlation values as a digital output, which is readily processed in the following circuit.

Further, as mentioned above, the construction for low-bit quantization and for computing an analog residual is provided in a unit circuit at an arbitrary stage other than the final stage. Hence, for example, it is also possible to dispose the construction for every other stage or every two stages with even intervals in accordance with resolution of required output. This arrangement makes it possible to satisfy the required function (resolution) with a minimum circuit construction.

Furthermore, as described above, a filter circuit of the present invention, in which a plurality of unit circuits are mutually connected in series, a computing means in each of the unit circuits successively transmits to a unit circuit of the following stage a computing result of a) an analog input signal sampled at the same sampling timing and b) a predetermined coefficient for each of the computing means, the computing means mutually adds the computing results of the present stage and its previous stage so as to compute in a unit circuit of the final stage a cumulative value of computing results of all the coefficients and time-series analog sampling signals whose number corresponds to that of the coefficients, and the cumulative value is outputted as digital data, is characterized in that low-bit quantization is subjected to an added value obtained by adding the computing result of the present stage to a cumulative value of the previous stage, a residual is computed by subtracting a D/A converted value of the quantization result from the added value in a unit circuit at an arbitrary stage other than the final stage so as to represent the cumulative value by a combined value of analog data and digital data, and at least the digital data is outputted from the unit circuit of the final stage.

According to this arrangement, each of the unit circuits computes a partial correlation value, and the cumulative value is represented by a combined value of the analog data and the digital data at an arbitrary stage or later. Namely, a computing result is subjected to low-bit quantization in a unit circuit at an arbitrary stage, in which the cumulative value exceeds a predetermined value, and the quantization result and an analog signal of a residual are successively outputted, the analog signal being obtained by subtracting an analog converted value of the quantization result from the cumulative value.

Hence, a dynamic range of the adding means for computing the cumulative value only needs to be set such that no saturation occurs on an added value of a) a partial correlation value obtained in each of the unit circuits and b) an analog signal of a residual from the unit circuit of the previous stage. Even in the case of a multi-stage construction with 256 or 512 stages for a matched filter, it is possible to reduce the circuit size and power consumption of the adding means. Without the necessity for a high-speed A/D digital converter with high resolution, it is possible to accurately obtain a cumulative value of partial correlation values as a digital output, which is easy to process in the following circuit.

Moreover, as described above, a filter circuit of the present invention, in which a plurality of unit circuits are mutually connected in series, a computing means in each of the unit circuits successively transmits to a unit circuit of the following stage a computing result of a) an analog input signal sampled at the same sampling timing and b) a coefficient predetermined for each of the computing means, the computing means mutually adds the computing results of the present stage and the its previous stage so as to compute in a unit circuit of the final stage a cumulative value of computing results of all the coefficients and time-series analog sampling signals whose number corresponds to that of the coefficients, and the cumulative value is outputted as digital data, is characterized by including a first adding means for mutually adding a computing result at the present stage and an output transmitted from the previous stage; a quantizing means which is provided in a unit circuit at the final stage and in a unit circuit at an arbitrary stage other than the final stage and which performs low-bit quantization on an output from the first adding means; a second adding means for adding a quantization result, which is obtained by the quantizing means at the present stage, to a quantization result of the previous stage; a D/A converting means for performing analog conversion on an output from the quantizing means; and a third adding means which subtracts an output of the D/A converting means from an output of the first adding means and outputs a residual to a unit circuit of the following stage.

According to this arrangement, the quantizing means is provided on a stage or a plurality of arbitrary stages and the final stage, where saturation may occur due to the arrangement of the coefficient on the analog first adding means, which computes a cumulative value of the partial correlation values transmitted from each of the computing means, the quantizing means performs low-quantization on a computing result, and the quantization result and an analog signal are outputted to the following stage, the analog signal corresponding to a residual obtained by the D/A converting means and the third adding means according to quantization. The second adding means is considerably smaller in power consumption than the first adding means serving as an analog adding means. The second adding means is formed by a counter and serves as a digital adding means.

For this reason, a dynamic range of the first adding means only needs to be set such that no saturation occurs on the added value of a) a partial correlation value obtained by the corresponding computing means and b) an analog signal of the residual from the third adder of the previous stage. Even in the case of a multi-stage construction with 256 or 512 stages for a matched filter, it is possible to reduce the circuit size and power consumption of the first adding means. Without the necessity for a high-speed A/D digital converter with high resolution, it is possible to accurately obtain a cumulative value of partial correlation values as a digital output, which is easy to process in the following circuit.

Additionally, as described above, a filter circuit of the present invention, in which a plurality of unit circuits are mutually connected in series, a computing means in each of the unit circuits successively transmits to a unit circuit of the following stage a computing result of a) an analog input signal sampled at the same sampling timing and b) a coefficient predetermined for each of the computing means, the computing means mutually adds the computing results of the present stage and its previous stage so as to compute in a unit circuit of the final stage a cumulative value of computing results of all the coefficients and time-series analog sampling signals whose number corresponds to that of the coefficients, and the cumulative value is outputted as digital data, is characterized by including a first adding means for mutually adding a computing result at the present stage and an output transmitted from the previous stage; a quantizing means which is provided in a unit circuit at the final stage and in a unit circuit at an arbitrary stage other than the final stage and which performs low-bit quantization on an output from the first adding means; a second adding means for adding a quantization result, which is obtained by the quantizing means at the present stage, to a quantization result of the previous stage; and a D/A converting means which performs analog conversion on an output from the quantizing means, sends the output to the first adding means of the following stage, and subtracts the output from an output of the first adding means at the present stage.

According to this arrangement, the quantizing means is provided on a stage or a plurality of arbitrary stages and the final stage, where saturation may occur due to the arrangement of the coefficient on the analog first adding means, which computes a cumulative value of the partial correlation values transmitted from each of the computing means, the quantizing means performs low-quantization on a computing result, and the quantization result, an analog converted value of the quantization result, that is obtained by the D/A converting means, and an analog signal transmitted from the first adding means are successively outputted to the following stage. In a first adding means of the following stage, the analog converted value of the quantization result is subtracted from the analog signal transmitted from the first adding means, so that an analog signal corresponding to a residual is obtained and is added to the computing result of the present stage. The second adding means is considerably smaller in power consumption than the first adding means serving as an analog adding means. The second adding means is formed by a counter and serves as a digital adding means.

Thus, a dynamic range of the first adding means only needs to be set such that no saturation occurs on the added value of a) a partial correlation value obtained by the corresponding computing means and b) an analog signal of the residual from the unit circuit of the previous stage. Even in the case of a multi-stage construction with 256 or 512 stages for a matched filter, it is possible to reduce the circuit size and power consumption of the first adding means. Without the necessity for a high-speed A/D digital converter with high resolution, it is possible to accurately obtain a cumulative value of partial correlation values as a digital output, which is easy to process in the following circuit.

Additionally, the filter circuit of the present invention is characterized in that the arbitrary unit circuit is provided at every predetermined number of stages and partial correlation values are periodically computed in accordance with the low-bit quantization.

According to this arrangement, the construction for computing the partial correlation values obtained by the low-bit quantization is not provided on the unit circuits of all the stages but is periodically provided at every predetermined number of stages with even intervals.

For this reason, it is possible to compute a correlation value so as to prevent a biased amount of analog calculation with a minimum construction and small power consumption while satisfying required resolution.

Moreover, the filter circuit of the present invention is characterized by further including a fourth adding means for subtracting an output of the A/D converting means, that serves as a computing means of the final stage, from an output of the first adding means serving as a computing means of the final stage so as to obtain an analog residual of the final stage; and an A/D converting means with high resolution, that performs A/D conversion on an output from the fourth adding means.

Digital conversion is performed on an analog residual, which is not quantized by the computing means of the final stage, by the A/D converting means with high resolution, and the residual is used as a part of a correlation output.

Hence, a correlation output with higher-significant bits, that is transmitted from the second adding means of a unit circuit at the final stage, is combined with a correlation output with lower-significant bits transmitted from the A/D converting means so as to form an actual correlation output, thereby obtaining a correlation output with high accuracy.

Furthermore, the filter circuit of the present invention is characterized by further including a first switching means which is provided between an analog input signal line and each of the computing means and which inputs a reference voltage instead of the analog input signal; a second switching means for extracting a DC offset caused by inputting the reference voltage to each of the computing means during a calibration mode; a memory for storing the DC offset; and a fifth adding means for subtracting the DC offset, which is stored in the memory, from a correlation output of the computing means at the final stage during a correlation computing mode so as to perform offset correction.

According to this arrangement, in the calibration mode in which the first switching means is switched to input a reference voltage to each of the computing means, a correlation output serves as a DC offset, the second switching means is switched to input the output from an output line of an ordinary correlation computing mode to the memory, and the output is stored therein.

Thus, in the ordinary correlation computing mode, the fifth adding means subtracts the stored value from the correlation output, so that it is possible to achieve a correlation output with high accuracy by removing the DC offset.

Furthermore, the filter circuit of the present invention is characterized in that all the second adding means are not equal in number of bits to the second adding means of the final stage, but the number of bits is gradually increased from the first stage to the final stage.

According to this arrangement, regarding the second adding means which performs a counting operation for adding a quantization result of the present stage to a quantization result obtained by the computing means of the previous stage, a bit number becomes larger from the first stage, which has a small count value, to the last stage.

Therefore, the second adding means only includes the required number of bits, thereby minimizing the circuit size of a flip flop.

Moreover, the filter circuit of the present invention includes a comparator as the quantizing means, which performs binary or ternary quantization.

According to this arrangement, as described above, the quantizing means is based on low-bit quantization, so that the quantizing means can be realized by a comparator with simple construction.

Furthermore, the filter circuit of the present invention is a matched filter in which the analog input signal is a spread spectrum receive signal, the coefficient is a spread code, each of the computing means is a correlation computing circuit for performing correlation computing of the spread spectrum receive signal and the spread code, the filter being a matched filter used for the spread spectrum receiver to perform reverse spread.

Conventionally, when base band processing is entirely performed by digital processing, electricity is largely consumed by the matched filter; meanwhile, according to this arrangement, the processing is mostly analog processing, so that power consumption of a base band processing section can be considerably reduced and the circuit size can be smaller.

Additionally, the filter circuit of the present invention has the computing means with M stages, which are an integral ø times larger than N code lengths of the spread code.

According to this arrangement, it is possible to obtain an adding-average of the correlation output, that is ø times larger than a symbol period (one period of a spread code) and to improve the accuracy of computing a correlation value, thereby accurately and promptly compensating for synchronization of spread spectrum communication.

Moreover, the filter circuit of the present invention is characterized in that the number of the stages for the computing means is M, which is equal to N number of code lengths of the code numeral, regarding an I component and a Q component, namely, 2N stages are provided, and an amplitude computing section is further provided.

According to this arrangement, an in-phase component (I component) and an orthogonal component (Q component) of the spread spectrum signal are respectively subjected to correlation computing with the spread code, and regarding the computing result, an amplitude value is computed by, for example, the square root of the sum of squares or by an approximate value thereof in the amplitude computing section so as to realize a complex matched filter.

Therefore, a base band processing section including such a matched filter can simultaneously modulate data columns of two systems, thereby improving the efficiency of transmitting information. Further, when the I component and the Q component have the same spread code, the code sequence is used in common so as to reduce its power consumption and circuit size as compared with forming two matched filters respectively for the I component and the Q component.

Moreover, the filter circuit of the present invention is characterized in that K groups of computing means with M stages are provided, the computing means at the same stage are equal in spread code, said respective computing means of each group receives clock signals, each having a phase shifted by 1/K of a chip period Tc, and a multiplexer is provided for successively selecting and outputting a correlation output for every Tc/K from the computing means of the final stage in each of the groups.

According to this arrangement, in the case of K=2, the computing means of a first system and the computing means of a second system receive clock signals, each having a phase shifted by Tc/2 from each other. Regarding the computing means of the final stage, a correlation value from the computing means of the system, in which a spread spectrum receive signal is subjected to sampling and the correlation value is computed, is selected in the multiplexer and is outputted as the correlation output.

Therefore, even when each of the computing means performs correlation computing at a low speed of every chip period Tc, a spread spectrum receive signal is subjected to sampling with a time interval equivalent to 1/K of a chip period Tc. Thus, a correlation value can be computed with precision with respect to time.

Furthermore, the filter circuit of the present invention is characterized in that the K computing means are connected in series at each of the M stages, and the computing means receive clock signals, each having a phase shifted by 1/K of the chip period Tc.

According to this arrangement, in the case of K=2, two computing means using the same spread code perform sampling on a spread spectrum receive signal at each stage of the M stages in response to clock signals, each having a phase shifted from each other by Tc/2, so that the two computing means alternately compute a correlation value.

For this reason, even when each of the computing means performs correlation computing at a low speed of every chip period Tc, a spread spectrum receive signal is subjected to sampling with a time interval equivalent to 1/K of the chip period Tc in the same manner as the aforementioned arrangement. Thus, as compared with the aforementioned arrangement, a correlation value can be computed with respect to time with precision without the multiplexer. In the case of K=2, a digital added value is increased by 1 bit and is increased by 2 bits in the case of K=4, so that synchronization of a spread spectrum receive signal can be compensated with accuracy.

Further, the filter circuit of the present invention is characterized in that all the coefficients are "1" and an A/D converted value is computed regarding a moving average of an analog input signal.

According to this arrangement, the coefficients are all switched to "1" in free time, when the matched filter does not perform synchronous compensation, so that an output from the second adding means at the final stage indicates an A/D converted value regarding a moving average value of an analog input signal. Hence, it is also possible to obtain an A/D converted value of the moving average value without the necessity for changing the other arrangements.

Furthermore, the filter circuit of the present invention is characterized in that some of the unit circuits connected in series are respectively provided parallelly into a plurality of columns, the computing means uses an analog input signal sampled at the same sampling timing, the computing means being provided in the stage in which a plurality of the stages correspond to one another, and an added value of the coefficients of the corresponding stages is divided and set at a target coefficient value for the stage between parallel unit circuits.

According to this arrangement, at a stage in which a relatively large coefficient value is set, a plurality of unit circuits are provided in series, and a coefficient value for the present stage is divided among the parallel unit circuits.

Therefore, in the unit circuits, it is possible to reduce a dynamic range of the adder for adding an analog computing result at the present stage and an analog residual from the previous stage. For example, the adder with a dynamic range of 3 is three to five times larger in power consumption than the adder with a dynamic range of 1. Thus, as compared with a single adder, it is possible to reduce the sum of the power consumption of the adders provided in the divided parallel unit circuits.

Moreover, the filter circuit of the present invention is characterized in that when a computing result of one of the columns is joined to the other column, a unit circuit of the other column having a) a multiplying coefficient of 0 regarding the analog input signal and a multiplying coefficient of 1, so that an analog residual of the one of the columns is inputted instead of the analog input signal and is added to an analog residual transmitted from the previous stage.

According to this arrangement, when a computing result of one of the columns is joined to the other, the unit circuit having a multiplying coefficient of 0 to an analog input signal shows a multiplying result of 0 regardless of an analog input signal. Hence, the unit circuit having the multiplying coefficient of 0 is used. Here, after completion for connecting the unit circuits of the one of the stages in series, when the unit circuit with a multiplying coefficient of 0 is not provided in the other column in the following stage, a unit circuit of another following stage, that has the multiplying coefficient of 0, is used by connecting the delay circuits in series. And then, the multiplying coefficient is set at 1 and an analog residual of the one of the columns is inputted instead of the analog input signal.

Therefore, in the adder of the joined unit circuit, it is fundamentally necessary to mutually add a multiplying result of the present stage, an analog residual from the previous stage, and a joining analog residual. A dynamic range similar to the adder of the other stage may cause overflow; meanwhile, the adder of the unit circuit having a multiplying coefficient of 0 only needs to mutually add the analog residual from the previous stage and the joining analog residual so as to eliminate the likelihood of the overflow in the same manner as the ordinary unit circuit.

Furthermore, the filter circuit of the present invention is characterized in that the analog input signal is a receive signal of a communication receiver or a signal subjected to frequency conversion, the coefficient determines a property of a band limitation filter, each of the computing means is a correlation computing circuit for performing correlation computing on the receive signal of the communication receiver or the signal subjected to frequency conversion and the coefficient for determining a property of the band limitation filter, the filter being a band limitation filter used for a converting section of a receive signal for a communication receiver.

According to this arrangement, in the band limitation filter used for the converting section of the receive signal for the communication receiver, it is necessary to use a relatively large coefficient value as described above, and the unit circuit has about 10 to 20 stages.

Consequently, even when joining is performed after the unit circuit at the final stage of the column having the largest number of stages so as to eliminate the necessity that a part of the unit circuits connected in series has a special arrangement for the foregoing joining and the necessity that a stage that should have a parallel construction is provided at a relatively earlier stage, only a relatively small number of the delay circuits are required on the parallel circuit side, thereby achieving a desirable arrangement.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A filter circuit, comprising:
   a plurality of unit circuits including a first stage unit circuit, at least one second stage unit circuit, and a final stage unit circuit mutually connected in series, each of said first stage unit circuit, said at least one second stage unit circuit, and said final stage unit circuit are consecutively arranged, each of said unit circuits comprising a computing means;
   said computing means in each of said first stage unit circuit and said at least one second stage unit circuit successively transmitting to a respective unit circuit of an immediately following stage a computing result of a) an analog input signal sampled at a same sampling timing and b) a coefficient predetermined for each of said computing means,
   said computing result of said computing means of each of said first stage unit circuit and said at least one second stage unit circuit being computed by
      adding a value of a residual, respectively input to each of the first stage unit circuit and said at least one second stage unit circuit from a respective unit circuit of a previous stage, and an analog computing result based on said analog input signal and a coefficient for said computing means, to obtain an added value,
      low-bit quantizing said added value to obtain a quantization result,
      subtracting a D/A converted value of the quantization result from the added value to obtain a residual value, and
      successively transmitting said quantization result as said computing result and said residual value to a following circuit,
   said computing means of each said first stage unit circuit and said at least one second stage unit circuit mutually adding said computing result and a computing result of a unit circuit of an immediately preceding stage so as to compute in said final stage unit circuit a cumulative value of computing results of all the coefficients and time-series analog sampling signals whose number corresponds to that of the coefficients, and the cumulative value is outputted as digital data,
   wherein said previous stage residual and computing result values for said first stage unit circuit are default values.

2. A filter circuit, comprising:
   a plurality of unit circuits including a first stage unit circuit, at least one second stage unit circuit, and a final stage unit circuit mutually connected in series, each of said first stage unit circuit, said at least one second stage unit circuit, and said final stage unit circuit are consecutively arranged, each of said unit circuits comprising a computing means;
   said computing means in each of said first stage unit circuit and said at least one second stage unit circuit successively transmitting to a respective unit circuit of an immediately following stage a computing result of a) an analog input signal sampled at a same sampling timing and b) a coefficient predetermined for each of said computing means,
   said computing result of said computing means of each of said first stage unit circuit and said at least one second stage unit circuit being computed by
      adding means for obtaining an added value,
      low-bit quantizating said added value to obtain a quantization result,
      subtracting a D/A converted value of the quantization result from the added value to obtain a residual value, and
      adding said quantization result to a cumulative value of a respective unit circuit of a previous stage to produce said computing result,
   said computing means of each said first stage unit circuit and said at least one second stage unit circuit mutually adding said computing result and a computing result of a unit circuit of an immediately preceding stage so as to compute in said final stage unit circuit a cumulative value of computing results of all the coefficients and time-series analog sampling signals whose number corresponds to that of the coefficients, and the cumulative value is outputted as digital data,
   wherein the D/A converted value of the quantization result is subtracted from the added value so as to suppress an increase in a dynamic range of said adding means in a unit circuit of the following stage.

3. A filter circuit, comprising
a plurality of unit circuits including a first stage unit circuit, at least one second stage unit circuit, and a final stage unit circuit mutually connected in series, each of said first stage unit circuit, said at least one second stage unit circuit, and said final stage unit circuit are consecutively arranged, each of said unit circuits comprising a computing means;
said computing means in each of said first stage unit circuit and said at least one second stage unit circuit successively transmitting to a respective unit circuit of an immediately following stage a computing result of a) an analog input signal sampled at a same sampling timing and b) a coefficient predetermined for each of said computing means,
said computing result of said computing means of each of said first stage unit circuit and said at least one second stage unit circuit being computed by
adding means for obtaining an added value,
low-bit quantizating said added value to obtain a quantization result,
subtracting a D/A converted value of the quantization result from the added value to obtain a residual value, and
adding said quantization result to a cumulative value of a respective unit circuit of a previous stage to produce said computing result,
said computing means of each of said first stage unit circuit and said at least one second stage unit circuit mutually adding said computing result and a computing result of a unit circuit of an immediately preceding stage so as to compute in said final stage unit circuit a cumulative value of computing results of all the coefficients and time-series analog sampling signals whose number corresponds to that of the coefficients, and the cumulative value is outputted as digital data from said final stage unit circuit,
wherein said previous stage residual and computing result values for said first stage unit circuit are default values.

4. A filter circuit, comprising:
a plurality of unit circuits including a first stage unit circuit, at least one second stage unit circuit, and a final stage unit circuit mutually connected in series, each of said first stage unit circuit, said at least one second stage unit circuit, and said final stage unit circuit are consecutively arranged, each of said unit circuits comprising a computing means;
said computing means in each of said first stage unit circuit and said at least one second stage unit circuit successively transmitting to a respective unit circuit of an immediately following stage a computing result of a) an analog input signal sampled at a same sampling timing and b) a coefficient predetermined for each of said computing means,
said computing means of each said first stage unit circuit and said at least one second stage unit circuit mutually adding said computing result and a computing result of a unit circuit of an immediately preceding stage so as to compute in said final stage unit circuit a cumulative value of computing results of all the coefficients and time-series analog sampling signals whose number corresponds to that of the coefficients, and the cumulative value is outputted as digital data,
wherein said previous stage computing result value for said first stage unit circuit is a default value, comprising:
first adding means for mutually adding the computing result at the present stage and an output transmitted from a unit circuit of an immediately preceding stage;
quantizing means which is provided in a unit circuit at the final stage and in a unit circuit at said at least one second stage unit circuit, and which performs low-bit quantization on an output from said first adding means;
second adding means for adding a quantization result, which is obtained by said quantizing means at the present stage, to a quantization result of the unit circuit of the immediately preceding stage;
D/A converting means for performing analog conversion on an output from said quantizing means; and
third adding means which subtracts an output of said D/A converting means from an output of said first adding means, and which outputs a residual to a unit circuit of the following stage.

5. A filter circuit, comprising:
a plurality of unit circuits including a first stage unit circuit, at least one second stage unit circuit, and a final stage unit circuit mutually connected in series, each of said first stage unit circuit, said at least one second stage unit circuit, and said final stage unit circuit are consecutively arranged, each of said unit circuits comprising a computing means;
said computing means in each of said first stage unit circuit and said at least one second stage unit circuit successively transmitting to a respective unit circuit of an immediately following stage a computing result of a) an analog input signal sampled at a same sampling timing and b) a coefficient predetermined for each of said computing means,
said computing means of each said first stage unit circuit and said at least one second stage unit circuit mutually adding said computing result and a computing result of a unit circuit of an immediately preceding stage so as to compute in said final stage unit circuit a cumulative value of computing results of all the coefficients and time-series analog sampling signals whose number corresponds to that of the coefficients, and the cumulative value is outputted as digital data wherein said previous stage values for said first stage unit circuit are default values, comprising:
first adding means for mutually adding the computing result at the present stage and an output transmitted from a unit circuit of an immediately preceding stage;
quantizing means which is provided in a unit circuit at the final stage and in a unit circuit at said at least one second stage unit circuit, and which performs low-bit quantization on an output from said first adding means;
second adding means for adding a quantization result, which is obtained by said quantizing means at the present stage, to a quantization result of the unit circuit of an immediately preceding stage; and
D/A converting means which performs analog conversion on an output from said quantizing means, sends the output to the first adding means of the following stage, and subtracts the output from an output of said first adding means of the present stage.

6. The filter circuit as defined in claim 1, wherein
said arbitrary unit circuit is provided at every predetermined number of stages and a partial correlation value is periodically computed in accordance with said low-bit quantization.

7. The filter circuit as defined in claim 5, further comprising:
fourth adding means for subtracting an output of said A/D converting means of the final stage from an output of said first adding means of the final stage so as to obtain an analog residual thereof; and
A/D converting means with high resolution, that performs A/D conversion on an output from said fourth adding means.

8. The filter circuit as defined in claim 5, further comprising:
first switching means which is provided between an analog input signal line and each of said computing means, and which inputs a reference voltage instead of the analog input signal;
second switching means for extracting a DC offset caused by inputting the reference voltage to each of the computing means during a calibration mode;
a memory for storing the DC offset; and
fifth adding means for subtracting the DC offset, which is stored in said memory, from a correlation output of said computing means at the final stage so as to correct the offset.

9. The filter circuit as defined in claim 5, wherein all second adding means are not equal in number of bits to the second adding means of the final stage, but the number of bits is gradually increased from a first stage to the final stage.

10. The filter circuit as defined in claim 5, wherein said quantizing means is a comparator, which performs binary or ternary quantization.

11. The filter circuit as defined in claim 1, wherein the analog input signal is a spread spectrum receive signal, the coefficient is a spread code, each of said computing means is a correlation computing circuit for performing correlation computing on the spread spectrum receive signal and the spread code, said filter being a matched filter used for a spread spectrum receiver to perform reverse spread.

12. The filter circuit as defined in claim 11, wherein said computing means with M stages, which are an integral times larger than N number of code lengths of the spread code.

13. The filter circuit as defined in claim 11, wherein said computing means has M stages, which is equal to N code lengths of the spread code, respectively for an I component and a Q component, and an amplitude computing section is further provided.

14. The filter circuit as defined in claim 11, wherein K groups of said computing means with M stages are provided, said computing means at the same stage are equal in spread code, said respective computing means of each group receives clock signals, each having a phase shifted by 1/K of a chip period Tc, and
a multiplexer is further provided for successively selecting and outputting a correlation output for every Tc/K from said computing means of the final stage in each of the groups.

15. The filter circuit as defined in claim 11, wherein said K computing means are connected in series at each of the M stages, and each of said computing means receives clock signals, each having a phase shifted by 1/K of a chip period Tc.

16. The filter circuit as defined in claim 11, wherein all the coefficients are set at "1" and an A/D converted value is computed regarding a moving average of an analog input signal.

17. The filter circuit as defined as claim 1, wherein some of the unit circuits connected in series are respectively provided in parallel into a plurality of columns, said computing means uses an analog input signal sampled at a similar sampling timing in the unit circuits of the stage that correspond with each other in the respective columns, and an added value of the coefficients of the corresponding stages is divided and set at a target coefficient value for the stage between parallel unit circuits.

18. The filter circuit as defined in claim 17, wherein when a computing result of one of said columns is joined to the other column, a unit circuit of the other column has a) a multiplying coefficient of 0 regarding the analog input signal and b) a multiplying coefficient of 1, so that an analog residual of the one of the columns is inputted instead of the analog input signal and is added to an analog residual transmitted from a previous stage.

19. The filter circuit as defined in claim 17, wherein the analog input signal is a receive signal of a communication receiver or a signal subjected to frequency conversion, the coefficient determines a property of a band limitation filter, said each computing means is a correlation computing circuit for performing correlation computing on the receive signal of the communication receiver or the signal subjected to frequency conversion and the coefficient for determining a property of the band limitation filter, said filter being a band limitation filter used for a converting section of a receive signal for a communication receiver.

20. A filter circuit having a plurality of series connected correlation computing unit circuits for cumulating a partial correlation value based on an analog input signal, which is subjected to sampling at a same timing, said computing unit circuits being consecutively arranged in stages, including a first stage and a final stage,
wherein at least one of the correlation computing unit circuits except for said final stage, comprising:
a first adder for adding a computing result of said at least one correlation computing unit circuit and an output of a correlation computing unit circuit of a stage immediately preceding that of said at least one correlation computing unit circuit;
a quantization circuit for performing low-bit quantization on an output of said first adder;
a first delay circuit for delaying the computing result by a chip period;
a second delay circuit for delaying an output of said quantization circuit by a chip period;
a D/A converter for converting an output of said second delay circuit to an analog signal;
a second adder for adding a partial correlation value of the stage immediately preceding that of said at least one correlation computing unit and an output of said quantization circuit;
a third delaying circuit for delaying an output of said second adder by a chip period so as to output as a partial correlation value to a correlation computing unit circuit of a stage immediately following that of said at least one correlation computing unit circuit; and
a third adder for outputting a residual to the correlation computing unit circuit of the immediately following stage, said residual being computed by subtracting an output of said D/A converter from an output of said first delay circuit.

21. The filter circuit as defined in claim 20, wherein among said correlation computing unit circuits, the correlation computing unit circuit for computing a partial correlation value by the low-bit quantization is determined according to resolution required for a correlation signal.

22. A filter circuit, comprising:

K (an integer) systems each having a plurality of correlation computing unit circuits, that perform a predetermined computing on an analog input signal producing a computing result in each computing unit circuit, which said analog input signal is subjected to sampling at a same timing, said correlation computing unit circuits being connected in series so as to cumulate a partial correlation value based on said computing result in each computing unit circuit, each said correlation computing unit circuit in a system of the K systems being a stage in the system, the stages of each system being consecutively arranged and start with a first stage and end with a final stage, wherein in said each system, at least one of said correlation computing unit circuits except for said final stage performs adding of the computing result computed in said at least one correlation computing unit circuit and an analog output of a correlation computing unit circuit of the immediately preceding stage of said at least one of said correlation computing unit circuits to produce an added value, low-bit quantizing said added value to produce a quantization result, and the correlation computing unit circuit a) adding the quantization result and the partial correlation value of the immediately preceding stage and delays said added value by a chip period so as to output an analog output to the correlation computing unit circuit of the immediately following stage of said at least one of said correlation computing unit circuits, and b) delays the quantization result by a chip period to produce a delayed result, D/A converting said delayed result to produce a converted analog result, and computing a residual by subtracting said converted analog result from said analog output based on said added value, said residual being computed in the correlation computing unit circuit of the immediately following stage, the K systems operate in response to clock signals, each having a phase shifted by 1/K of a chip period, and a selecting circuit is further provided for selecting a cumulated partial correlation value of each of the systems in response to the clock signal.

23. A filter circuit, comprising:

first and second systems having a plurality of correlation computing unit circuits, that perform predetermined computing on an analog input signal producing a computing result in each computing unit circuit, which said analog input signal is subjected to sampling at a same timing, said correlation computing unit circuits being connected in series so as to cumulate a partial correlation value based on said computing result in each computing unit circuit, each said correlation computing unit circuit in a system of the first and second systems being a stage in the system, the stages in each system being consecutively arranged and start with a first stage and end with a final stage, wherein in said each system, at least one of said correlation computing unit circuits except for said final stage performs adding of the computing result computed in said at least one correlation computing unit circuit and an analog output of a correlation computing unit circuit of the immediately preceding stage of said at least one of said correlation computing unit circuits to produce an added value, low-bit quantizing said added value to produce a quantization result, and the correlation computing unit circuit a) adding the quantization result and the partial correlation value of the immediately preceding stage and delays said added value by a chip period so as to output an analog output to the correlation computing unit circuit of the immediately following stage of said at least one of said correlation computing unit circuits, and b) delays the quantization result by a chip period to produce a delayed result, D/A converting said delayed result to produce a converted analog result, and computing a residual by subtracting said converted analog result from said analog output based on said added value, said residual being computed in the correlation computing unit circuit of the immediately following stage, said first and second systems operate in response to clock signals, each having a phase shifted by a half of a chip period, a common-mode component of the analog input signal is inputted to said first system, an orthogonal component of the analog input signal is inputted to the second system, and an amplitude computing section is further provided for computing an amplitude value according to a cumulated partial correlation value of said first system and each cumulated partial correlation value of said second system and for outputting the amplitude value as an amplitude correlation output for every chip period.

* * * * *